United States Patent
Lee

(10) Patent No.: US 9,209,134 B2
(45) Date of Patent: Dec. 8, 2015

(54) METHOD TO INCREASE INTERCONNECT RELIABILITY

(71) Applicant: Intermolecular, Inc., San Jose, CA (US)

(72) Inventor: Mankoo Lee, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 15 days.

(21) Appl. No.: 13/904,360

(22) Filed: May 29, 2013

(65) Prior Publication Data

US 2014/0264871 A1 Sep. 18, 2014

Related U.S. Application Data

(60) Provisional application No. 61/782,449, filed on Mar. 14, 2013.

(51) Int. Cl.
| | |
|---|---|
| H01L 21/768 | (2006.01) |
| H01L 23/532 | (2006.01) |
| C23C 16/04 | (2006.01) |
| C23C 16/455 | (2006.01) |

(52) U.S. Cl.
CPC .......... *H01L 23/53238* (2013.01); *C23C 16/04* (2013.01); *C23C 16/45544* (2013.01); *H01L 21/76873* (2013.01); *H01L 21/76883* (2013.01); *H01L 23/53233* (2013.01); *H01L 23/53295* (2013.01); *H01L 21/76843* (2013.01); *H01L 21/76849* (2013.01); *H01L 2221/1089* (2013.01)

(58) Field of Classification Search
USPC ........................................................ 438/687
See application file for complete search history.

(56) References Cited

U.S. PATENT DOCUMENTS

| | | | |
|---|---|---|---|
| 6,492,268 B1 * | 12/2002 | Pyo ............................... | 438/687 |
| 6,500,754 B1 | 12/2002 | Erb et al. | |
| 6,790,774 B2 | 9/2004 | Fujikawa et al. | |
| 7,507,659 B2 * | 3/2009 | Ohtsuka et al. ............... | 438/643 |
| 2001/0051420 A1 * | 12/2001 | Besser et al. .................. | 438/597 |
| 2003/0013320 A1 * | 1/2003 | Kim et al. ...................... | 438/778 |
| 2007/0082508 A1 * | 4/2007 | Chiang et al. ................. | 438/800 |
| 2009/0061646 A1 * | 3/2009 | Chiang et al. ................. | 438/763 |
| 2009/0275210 A1 * | 11/2009 | Shanker et al. ............... | 438/761 |
| 2010/0065967 A1 * | 3/2010 | Koike et al. ................... | 257/751 |
| 2010/0193953 A1 * | 8/2010 | Amano et al. ................. | 257/751 |
| 2010/0267228 A1 * | 10/2010 | Koike et al. ................... | 438/643 |

(Continued)

OTHER PUBLICATIONS

Lee et al.; A Highly Reliable Cu Interconnect Technology for Memory Device; 2007; IEEE; pp. 64-66.

(Continued)

*Primary Examiner* — Anthony Ho
*Assistant Examiner* — Samuel Lair

(57) ABSTRACT

Methods to increase metal interconnect reliability are provided. Methods include forming a conformal barrier layer within an opening in a semiconductor device structure and forming a copper alloy material above the conformal barrier layer. Next, removing the copper alloy material that extends beyond the opening. Removing native oxide from a top surface of the copper alloy material. Further, annealing or applying a plasma treatment to the copper alloy material. Finally, forming a capping layer above the copper alloy material. Notably, near the top of the copper alloy material, smaller copper grain growth may be present. Furthermore, more non-copper alloy atoms are present near the top of the copper alloy material than the bulk of the copper alloy material.

20 Claims, 16 Drawing Sheets

(56) References Cited

U.S. PATENT DOCUMENTS

2011/0254164 A1* 10/2011 Gordon et al. ............ 257/751
2014/0110764 A1* 4/2014 Niyogi et al. ............ 257/288

OTHER PUBLICATIONS

Ingerly et al.; Low-k Interconnect Stack with Metal-Insulator-Metal Capacitors for 22nm High Volume Manufacturing; 2012; IEEE; 3 pages.

Ogawa et al.; Stress-Induced Voiding Under Vias Connected to Wide Ch Metal Leads; 2002; IEEE; 40th Annual International Reliability Physics Symposium, Dallas, Texas; pp. 312-321.

Heryanto et al.; The effect of stress migration on electromigration in dual damascene copper interconnects; Jan. 14, 2011; American Institute of Physics; Journal of Applied Physics; pp. 013716-1-013716-9.

Kitao et al.; Behavior of the Alloying Element in Cu Interconnects; 2011; IEEE; 3 pages.

Isobayashi et al.; Thermally Robust Cu Interconnects with Cu—Ag Alloy for sub 45nm Node; 2004; IEEE; pp. 38.6.1-38.6.4.

* cited by examiner

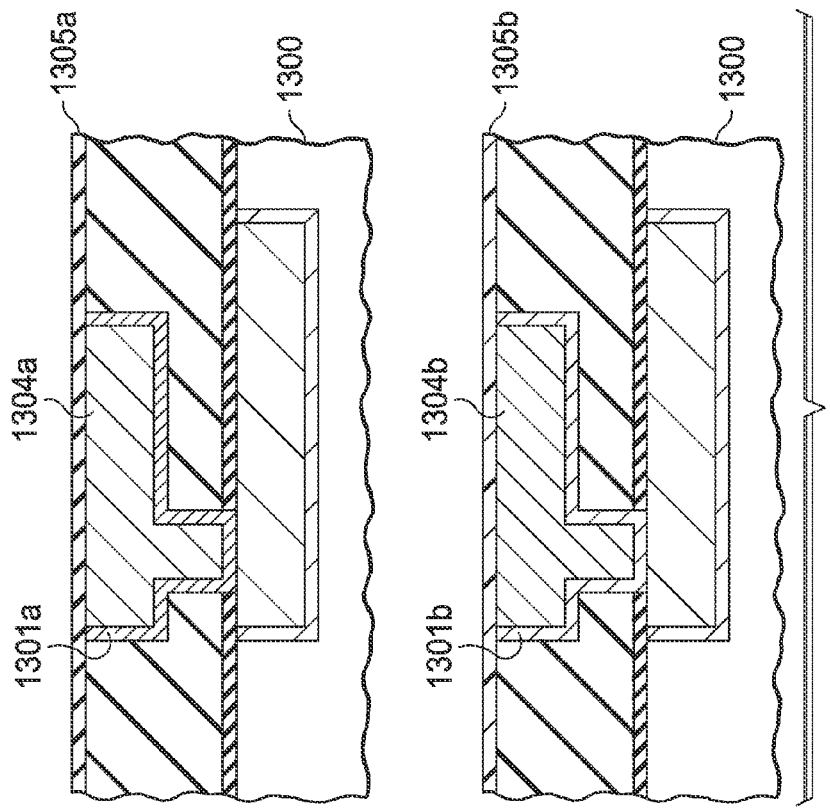
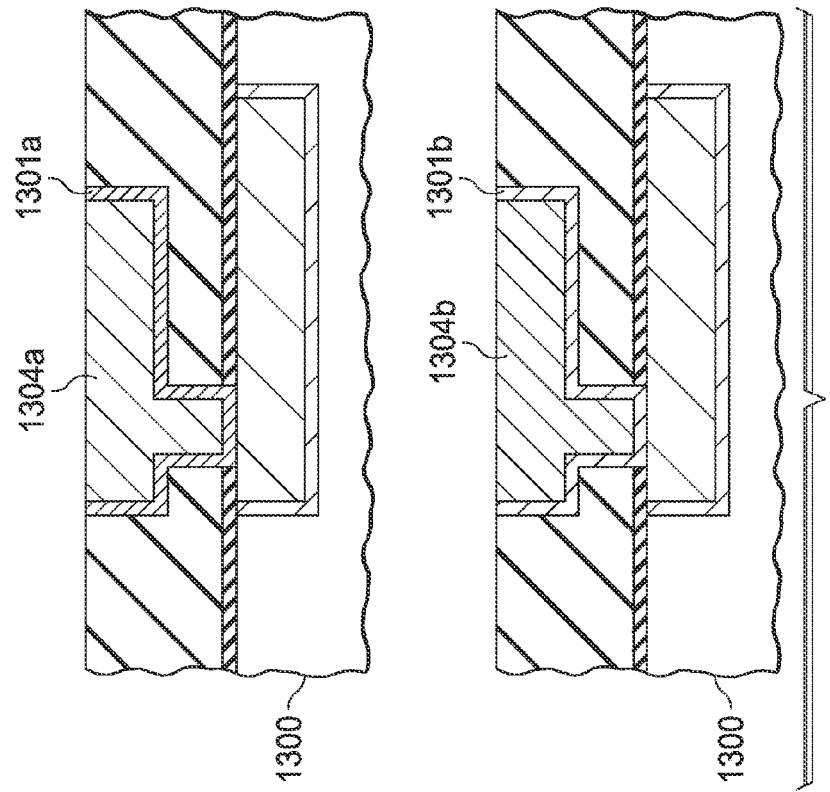

METHOD TO INCREASE INTERCONNECT RELIABILITY

FIELD

The present disclosure relates to systems and methods to increase metal interconnect reliability by reducing electromigration, stress migration, and line resistance.

BACKGROUND

Present technologies feature metal interconnects with widths as small as 22 nm (e.g., copper interconnects). Future technologies may scale the size of metal interconnects even further. As devices within integrated circuits (ICs) continue to scale, electromigration (EM), stress migration (SM), and line resistance degradation must be reduced.

Small grain sizes within interconnect materials and the prevalent use of high resistivity barriers materials (e.g., TaN/Ta) in conventional semiconductor devices pose challenges to reduce these effects. Additionally, surface scattering and line to line coupling capacitances within metal interconnects should also be addressed to lower line resistance.

Therefore, what is needed is a method to reduce line resistance, EM and SM and optimize the required resistive-capacitance (RC) delay targets in metal interconnects. The present disclosure addresses such a need.

SUMMARY OF THE DISCLOSURE

The following summary is included in order to provide a basic understanding of some aspects and features of the present disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

Methods to increase metal interconnect reliability are provided. Methods include forming a conformal barrier layer within an opening in a semiconductor device structure and forming a copper alloy material above the conformal barrier layer. Next, removing the copper alloy material that extends beyond the opening. Additionally, removing native oxide from a top surface of the copper alloy material.

Further, annealing or applying a plasma treatment to the copper alloy material. Finally, forming a capping layer above the copper alloy material. Notably, near the top surface of the copper alloy material, smaller copper grain growth may be present due to oxygen impurities. Furthermore, more non-copper alloy atoms are present near the top of the copper alloy material than the bulk of the copper alloy material.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale. The techniques of the present disclosure may readily be understood by considering the following detailed description in conjunction with the accompanying drawings, in which:

FIGS. 13A-13D illustrates an exemplary deposition sequence for forming multilayer film stacks in a combinatorial fashion.

DETAILED DESCRIPTION

Figure 1:
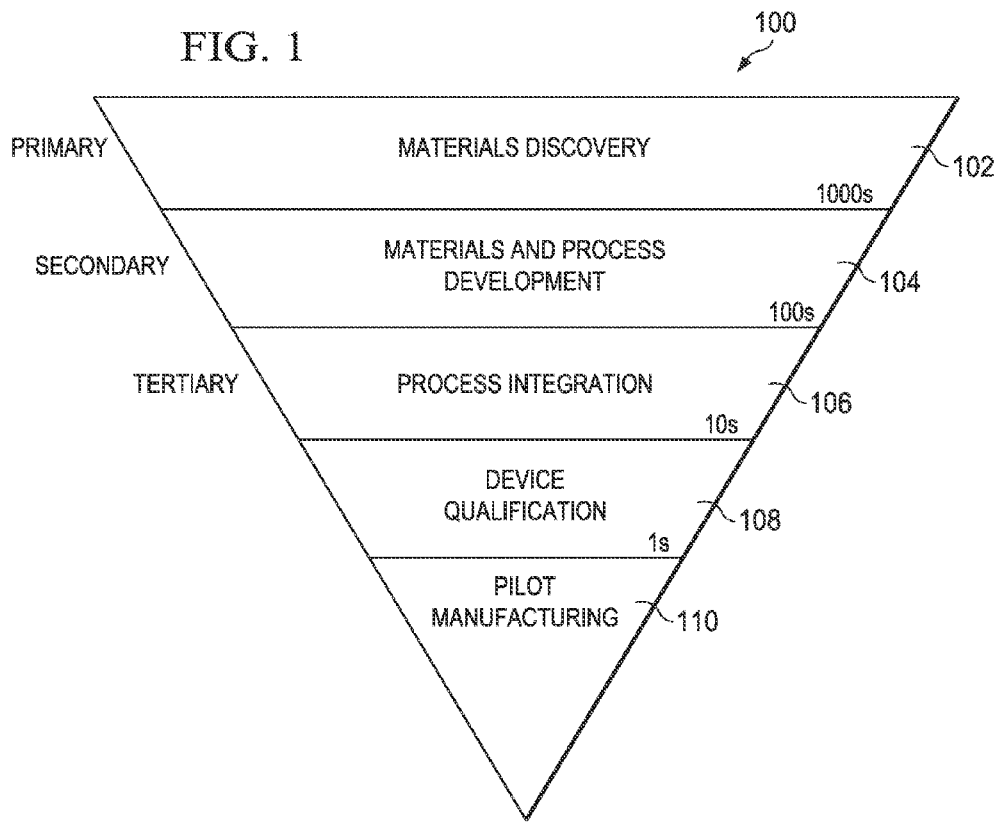
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Methods to increase metal interconnect reliability are provided. Methods include forming a conformal barrier layer within an opening in a semiconductor device structure and forming a copper alloy material above the conformal barrier layer. Next, removing the copper alloy material that extends beyond the opening. Additionally, removing native oxide from a top surface of the copper alloy material.

Further, annealing or applying a plasma treatment to the copper alloy material. Finally, forming a capping layer above the copper alloy material. Notably, near the top surface of the copper alloy material, smaller copper grain growth may be present due to oxygen impurities. Furthermore, more non-copper alloy atoms are present near the top of the copper alloy material than the bulk of the copper alloy material.

It is to be understood that unless otherwise indicated this disclosure is not limited to specific layer compositions or surface treatments. It is also to be understood that the terminology used herein is for the purpose of describing particular embodiments only and is not intended to limit the scope of the present disclosure.

It must be noted that as used herein and in the claims, the singular forms "a," and "the" include plural referents unless the context clearly dictates otherwise. Thus, for example, reference to "a layer" also includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region may include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, coated silicon, other semiconductor materials, glass, polymers, metal foils, etc. The term "substrate" or "wafer" may be used interchangeably herein. Semiconductor wafer shapes and sizes may vary and include commonly used round wafers of 2", 4", 200 mm, or 300 mm in diameter.

The term "remote plasma source" as used herein refers to a plasma generator (e.g., an rf or microwave plasma generator) located at a distance from a deposition or treatment location sufficient to allow some filtering of the plasma components. For example, the density of ions and electrons may be adjusted by distance, and electrons and ions may also be filtered using suitable electrode configurations, such as a grounded metal showerhead so that only atomic or molecular radicals reach the substrate.

It is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This may greatly improve both the speed and reduce the costs associated with the discovery, implementation, optimization, and qualification of material(s), process(es), and process integration sequence(s) required for manufacturing.

Systems and methods for HPC™ processing are described in U.S. Pat. No. 7,544,574 filed on Feb. 10, 2006; U.S. Pat. No. 7,824,935 filed on Jul. 2, 2008; U.S. Pat. No. 7,871,928 filed on May 4, 2009; U.S. Pat. No. 7,902,063 filed on Feb. 10, 2006; and U.S. Pat. No. 7,947,531 filed on Aug. 28, 2009 which are all herein incorporated by reference for all purposes. Systems and methods for HPC™ processing are further described in U.S. patent application Ser. No. 11/352,077 filed on Feb. 10, 2006, claiming priority from Oct. 15, 2005; U.S. patent application Ser. No. 11/419,174 filed on May 18, 2006, claiming priority from Oct. 15, 2005; U.S. patent application Ser. No. 11/674,132 filed on Feb. 12, 2007, claiming priority from Oct. 15, 2005; and U.S. patent application Ser. No. 11/674,137 filed on Feb. 12, 2007, claiming priority from Oct. 15, 2005 which are all herein incorporated by reference for all purposes.

HPC™ processing techniques have been successfully adapted to wet chemical processing such as etching, texturing, polishing, cleaning, etc. HPC™ processing techniques have also been successfully adapted to deposition processes such as physical vapor deposition (PVD) (i.e. sputtering), atomic layer deposition (ALD), and chemical vapor deposition (CVD).

In addition, systems and methods for combinatorial processing and further described in U.S. patent application Ser. No. 13/341,993 filed on Dec. 31, 2011 and U.S. patent application Ser. No. 13/302,730 filed on Nov. 22, 2011 which are all herein incorporated by reference for all purposes.

HPC™ processing techniques have been adapted to the development and investigation of absorber layers and buffer layers for TFPV solar cells as described in U.S. patent application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference for all purposes.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages may be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e. microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes may proceed to pilot manufacturing 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from HPC™ techniques described in U.S. patent application Ser. No. 11/674,137 filed on Feb. 12, 2007 which is hereby incorporated for reference for all purposes. Portions of the '137 application have been reproduced below to enhance the understanding of the present disclosure.

While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete site-isolated region. Furthermore, while different materials or unit processes may be used for corresponding layers or steps in the formation of a structure in different site-isolated regions of the substrate during the combinatorial processing, the application of each layer or use of a given unit process is substantially consistent or uniform throughout the different site-isolated regions in which it is intentionally applied. Thus, the processing is uniform within a site-isolated region (inter-region uniformity) and between site-isolated regions (intra-region uniformity), as desired. It should be noted that the process may be varied between site-isolated regions, for example, where a thickness of a layer is varied or a material may be varied between the site-isolated regions, etc., as desired by the design of the experiment.

The result is a series of site-isolated regions on the substrate that contain structures or unit process sequences that have been uniformly applied within that site-isolated region and, as applicable, across different site-isolated regions. This process uniformity allows comparison of the properties within and across the different site-isolated regions such that the variations in test results are due to the varied parameter (e.g., materials, unit processes, unit process parameters, hardware details, or process sequences) and not the lack of process uniformity. In the embodiments described herein, the positions of the discrete site-isolated regions on the substrate may be defined as needed, but are preferably systematized for ease of tooling and design of experimentation. In addition, the number, variants and location of structures within each site-isolated region are designed to enable valid statistical analysis of the test results within each site-isolated region and across site-isolated regions to be performed.

Figure 2:
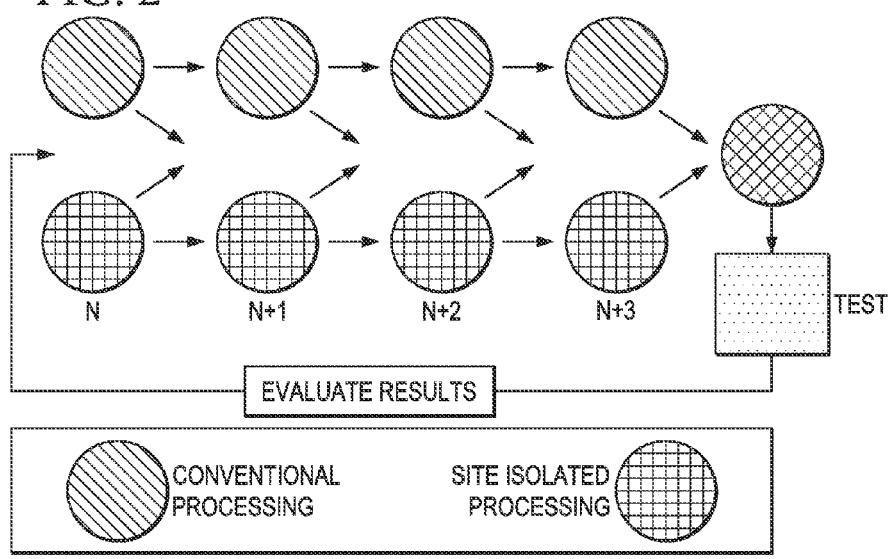
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing. In some embodiments, the substrate is initially processed using conventional process N. In some exemplary embodiments, the substrate is then processed using site-isolated process N+1. During site isolated processing, an HPC™ module may be used, such as the HPC module described in U.S. patent application Ser. No. 11/352,077 filed on Feb. 10, 2006, which is incorporated herein by reference for all purposes. The substrate may then be processed using site isolated process N+2, and thereafter processed using conventional process N+3. Testing is performed and the results are evaluated. The testing may include physical, chemical, acoustic, magnetic, electrical, optical, etc. tests. From this evaluation, a particular process from the various site isolated processes (e.g., from steps N+1 and N+2) may be selected and fixed so that additional combinatorial process sequence integration may be performed using site isolated processing for either process N or N+3. For example, a next process sequence may include processing the substrate using site isolated process N, conventional processing for processes N+1, N+2, and N+3, with testing performed thereafter.

It should be appreciated that various other combinations of conventional and combinatorial processes may be included in the processing sequence with regard to FIG. 2. That is, the combinatorial process sequence integration may be applied to any desired segments and/or portions of an overall process flow. Characterization, including physical, chemical, acoustic, magnetic, electrical, optical, etc. testing, may be performed after each process operation, and/or series of process operations within the process flow as desired. The feedback provided by the testing is used to select certain materials, processes, process conditions, and process sequences and eliminate others. Furthermore, the above flows may be applied to entire monolithic substrates, or portions of monolithic substrates such as coupons.

Under combinatorial processing operations the processing conditions at different site-isolated regions may be controlled independently. Consequently, process material amounts, reactant species, processing temperatures, processing times, processing pressures, processing flow rates, processing powers, processing reactant compositions, the rates at which the reactions are quenched, deposition order of process materials, process sequence steps, hardware details, etc., may be varied from site-isolated region to site-isolated region on the substrate. Thus, for example, when exploring materials, a processing material delivered to a first and second site-isolated regions may be the same or different. If the processing material delivered to the first site-isolated region is the same as the processing material delivered to the second isolated-region, this processing material may be offered to the first and second site-isolated regions on the substrate at different concentrations. In addition, the material may be deposited under different processing parameters. Parameters which may be varied include, but are not limited to, process material amounts, reactant species, processing temperatures, processing times, processing pressures, processing flow rates, processing powers, processing reactant compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used may be varied.

As mentioned above, within a site-isolated region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the site-isolated regions. It should be appreciated that a site-isolated region may be adjacent to another site-isolated region in some embodiments or the site-isolated regions may be isolated and, therefore, non-overlapping. When the site-isolated regions are adjacent, there may be a slight overlap wherein the materials or precise process interactions are not known, however, a portion of the site-isolated regions, normally at least 50% or more of the area, is uniform and all testing occurs within that site-isolated region. Further, the potential overlap is only allowed with material of processes that will not adversely affect the result of the tests. Both types of site-isolated regions are referred to herein as site-isolated regions or discrete site-isolated regions.

Substrates may be a conventional round 200 mm, 300 mm, or any other larger or smaller substrate/wafer size. In some embodiments, substrates may be square, rectangular, or any other shape. One skilled in the art will appreciate that substrate may be a blanket substrate, a coupon (e.g., partial wafer), or even a patterned substrate having predefined site-isolated regions. In some other embodiments, a substrate may have site-isolated regions defined through the processing described herein.

Software is provided to control the process parameters for each wafer for the combinatorial processing. The process parameters comprise selection of one or more source gases for the plasma generator, plasma filtering parameters, exposure time, substrate temperature, power, frequency, plasma generation method, substrate bias, pressure, gas flow, or combinations thereof.

Plasmas are widely used for a variety of treatment and layer deposition tasks in semiconductor fabrication. These applications include subtractive processes such as wafer precleaning, contaminant removal, native oxide removal, photoresist removal, as well as additive processes such as deposition, oxidation, nitridation, or hydridation of a layer both during and after formation. "Remote" plasma sources are frequently used, where the plasma generator is located at some distance from the surface to be treated or substrate on which a layer is to be formed. The distance allows filtering of the charged particles in the plasma. For example, the density of ions and electrons may be adjusted by distance. The electrons and ions may be removed from the generated plasma using suitable electrode configurations such as a grounded metal showerhead, so that, for example, only atomic radicals and molecule radicals (but not ions) reach the substrate.

The plasma generator for a remote plasma source may use any known means of applying energy to atoms or molecules to ionize them and create a plasma. The energy source may be, for example, electromagnetic energy such as microwaves or radio frequency energy or lasers.

Conventional systems using remote plasma sources were designed to treat the entire area of a substrate such as a 300 mm wafer. Combinatorial processing is difficult and expensive when the entire area of a substrate may only receive a single process variation. Embodiments of the present disclosure overcome this limitation by providing a remote plasma source, an associated substrate positioning system, and a site isolation system that allows a selected site-isolated region of a substrate to be processed while the remaining site-isolated regions of the substrate are protected from exposure to the plasma and reactive radical species unless or until such exposure is intended.

Figure 3:
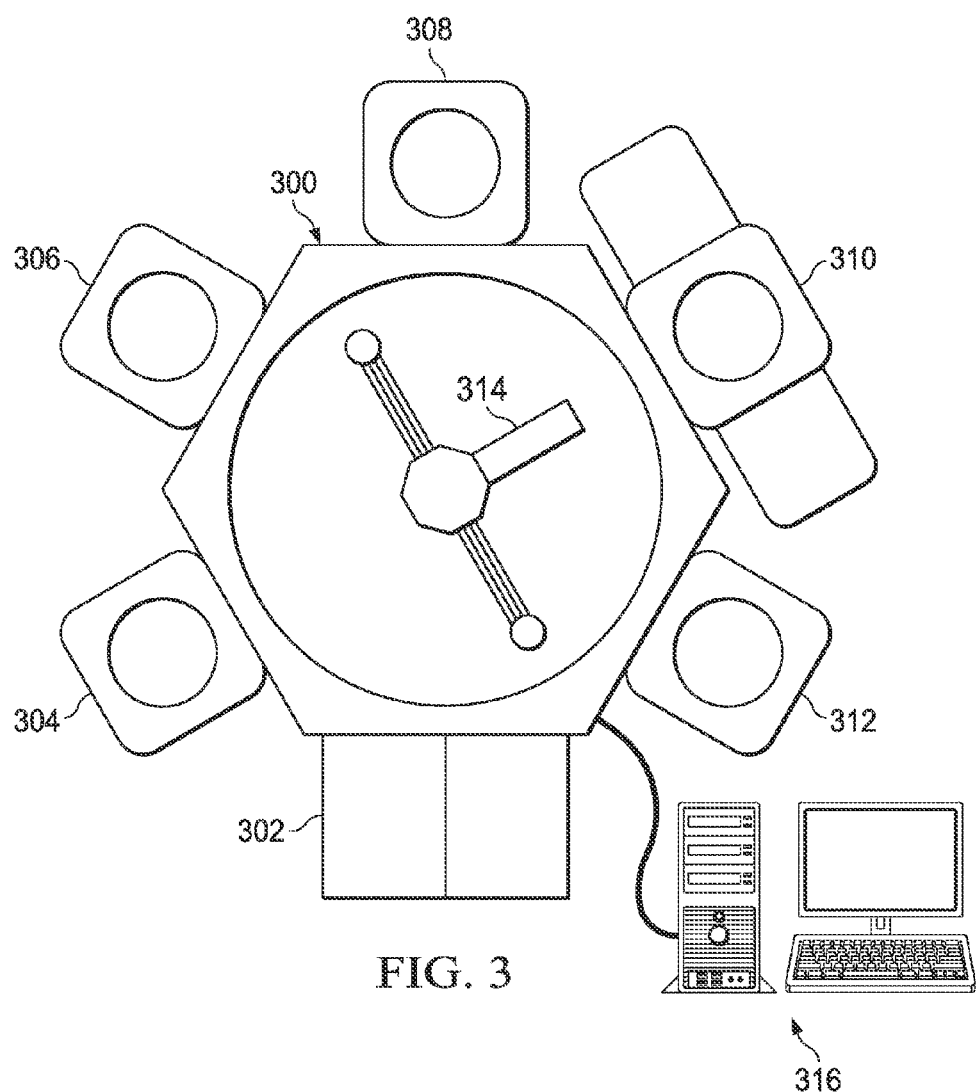
FIG. 3 is a simplified schematic diagram illustrating an integrated high productivity combinatorial (HPC) system.

FIG. 3 is a simplified schematic diagram illustrating an integrated high productivity combinatorial (HPC) system. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that may be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. patent application Ser. Nos. 11/672,473 and 11/672,478, the entire disclosures of which are herein incorporated by reference for all purposes. In a HPC system, a plurality of methods may be employed to deposit material upon a substrate employing combinatorial processes.

Figure 4:
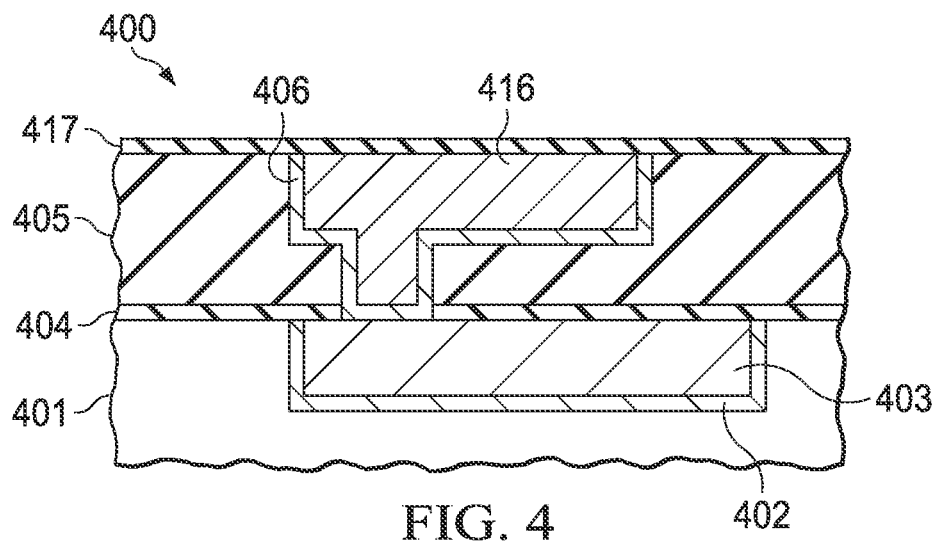
FIG. 4 is a simplified schematic diagram illustrating a semiconductor device structure having components and features consistent with the present disclosure.

FIG. 4 is a simplified schematic diagram illustrating a semiconductor device structure 400 having components and features consistent with the present disclosure. As shown, semiconductor device structure 400 comprises a first dielectric material 401 upon which a first barrier layer 402, first metal layer 403, and a first capping layer 404 are formed therein. In some embodiments, first barrier layer 402 and first metal layer 403 may be referred collectively as a metal interconnect.

Formed above first capping layer 404 is a second dielectric material 405 with a second barrier layer 406, second metal layer 416 (collectively a metal interconnect), and a second capping layer 417 formed therein. In some embodiments, first metal layer 403 and second metal layer 416 comprises a seed metal material and a bulk metal material therein.

In some embodiments, barrier layers 402, 406 are conformal such that they have good adhesion to the inside surface of a via or a trench. Furthermore, barrier layers 402, 406 may be formed to a sufficient thickness to prevent metal atom diffusion. Exemplary materials for barrier layers 402, 406 are ruthenium (Ru), tungsten (W), titanium silicon nitride (TiSiN), tantalum (Ta), tantalum nitride (TaN or TaN$_x$), Ta/TaN, ruthenium tantalum nitride (RuTaN), and cobalt (Co). In addition, the thickness of barrier layers 402, 406 may be in the range of 20-70 angstroms.

The metal interconnects may comprise copper and its alloy elements such as gold (Au), silver (Ag), carbon (C) in carbon nanotube materials (CNTs), manganese (Mn), indium (In), tin (Sn), zinc (Zn), cobalt (Co), palladium (Pd), iron (Fe), berrylium (Be), magnesium (Mg), and aluminum (Al).

In some embodiments, the first metal interconnect and the second metal interconnect each comprises low resistive material-based copper alloys. For example, materials having low resistivities may be incorporated into the bulk metal material. Exemplary copper alloy materials with low resistivities may include gold (Au), silver (Ag), and carbon nanotube materials (CNT).

In some embodiments, near the top surfaces (e.g., within 50 angstroms) of the first and second metal interconnects 403, 416, small copper grain growth may be present due to oxygen impurities from precursors used in CVD oxide process(es). As such, more non-copper alloy atoms may be introduced near the top surfaces of the first and second metal interconnects 403, 416 (e.g., within 50 angstroms from an interface between the capping layers 404, 417 and the first and second metal interconnects 403, 416, respectively) to reduce effects from oxygen impurities.

In some embodiments, near the top of the first and second metal interconnects, the non-copper alloy atoms have a concentration of approximately 1% of the copper alloy density. For example, when first and second metal interconnects a Cu—Mn alloy, the amount of manganese atoms near the top of the metal interconnects may be approximately $8 \times 10^{20}$ atoms/cm$^3$. However, the amount of manganese atoms in the bulk area of interconnects may be considerably less, approximately $1 \times 10^{20}$ atoms/cm$^3$.

It should be understood by one having ordinary skill in the art that the ratio of copper alloy atoms near the top of the metal interconnects and the bulk of the metal interconnects is not limited to 8, as in the previous example. The ratio may be >1, 2, 5, 8 or other integer so long as the quantity of non-copper alloy atoms are sufficient to limit copper atom diffusion as will be explained below.

In some embodiments, the non-copper alloy atoms (e.g., manganese atoms) may be trapped into oxygen sites near the interface between the capping layers 404, 417 and the first and second metal interconnects 403, 416, respectively. For instance, manganese atoms may be trapped into oxygen sites such that MnO may be formed. Accordingly, the amount of manganese or other non-copper atoms may be greater near the interface than in the bulk area of the interconnects.

Capping layers 404, 417 are shown to be disposed above the first and second metal interconnects. In some embodiments, capping layers 404, 417 may improve metallurgical interface properties between the bulk metal layer and the dielectric material (e.g., first and second dielectric materials 401, 405) leading to enhanced EM and SM reliability. Moreover, capping layers 404, 417 may serve as passivation layers for the formed metal interconnects below.

Capping layers 404, 417 may be subjected to a surface treatment which may provide better interface treatment with the bulk metal alloy material such that electron mobility degradation is minimized.

Exemplary materials for capping layers 404, 417 include cobalt tungsten phosphorous (CoWP), cobalt tin phosphorous (CoSnP), cobalt tungsten boron (CoWB), silicon carbon nitride (SiCN), and silicon nitride (SiN).

Figure 5:
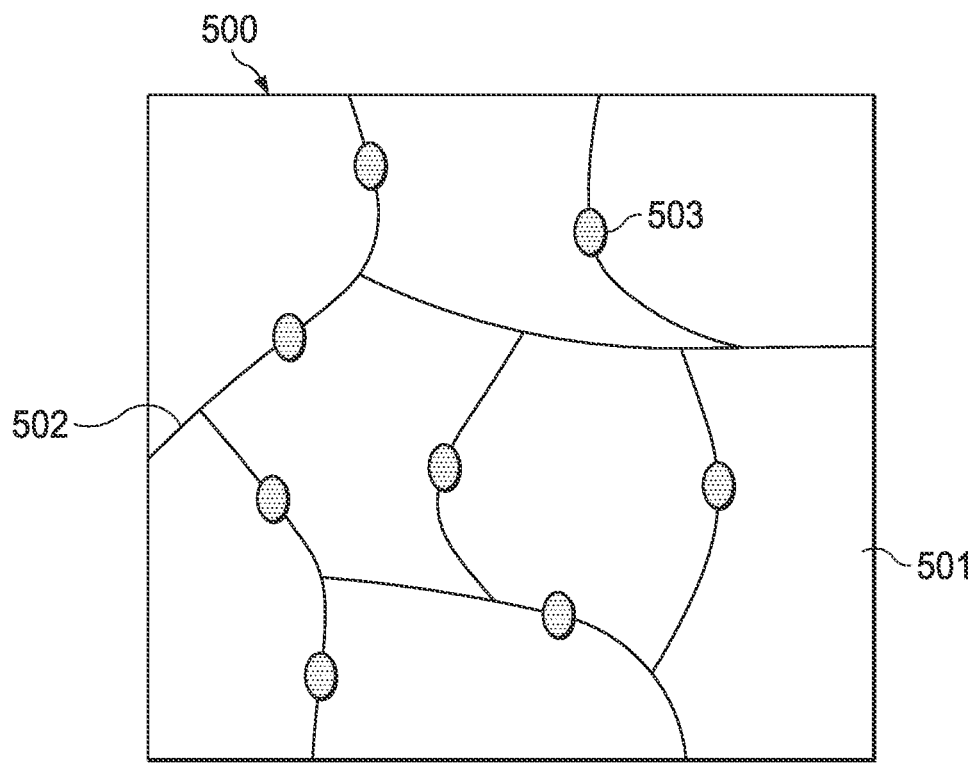
FIG. 5 is a simplified schematic diagram illustrating various grain structures of metal interconnects comprising a polycrystalline copper alloy material.

FIG. 5 is a simplified schematic diagram illustrating various grain structures 501 of a polycrystalline copper alloy material 500. Copper alloy material 500 includes a plurality of copper grain structures 501, grain boundaries 502, and non-copper atoms (i.e., Cu alloy atoms) 503.

One having ordinary skill in the art may appreciate that polycrystalline materials may have a material structure consisting of many individual grain structures also referred to as crystallites. Because various grain structures are present within polycrystalline materials, grain boundaries exist between them. The size and orientation of grain structures within polycrystalline materials effect various material properties (e.g., electrical).

In some embodiments, the grain structures within the metal interconnects should be relatively large to minimize electron scattering against the metal interconnect/capping layer. In addition, large grain structure sizes may minimize copper atom diffusion within the interior of each grain structure.

One having ordinary skill in the art may appreciate that copper grain growth near the top of copper alloy material 500 may be smaller than copper grain growth in the bulk of the copper alloy material 500. In some embodiments, near the top of copper alloy material 500 may be within fifty angstroms of the copper alloy material 500/capping layer interface (for capping layer, see FIG. 4).

Further, the ratio of the average grain growth of copper grain structures 501 in the bulk of the copper alloy material 500 in comparison to the grain growth of copper grain structures near the top of the copper alloy material 500 may range from 3-4. Accordingly, the average size of each copper grain structure 501 in the bulk of the copper alloy material 500 may be as large as four times the average size of each copper grain structure 501 near the top of the copper alloy material 500.

One having ordinary skill in the art may also appreciate that the size differential of copper grain structures 501 near the top and bulk of the copper alloy material 500 may be due to various factors such as, but not limited to, oxygen impurities introduced into the material 500 during a CVD oxide process.

Because copper atom diffusion is a cause of EM and SM within metal interconnects, non-copper atoms 503 may be employed to limit copper atom diffusion along the grain boundaries 502. Although, bulk metal migration may still be possible, the primary mechanism for EM and SM within metal interconnects may be significantly reduced.

Figure 7A:
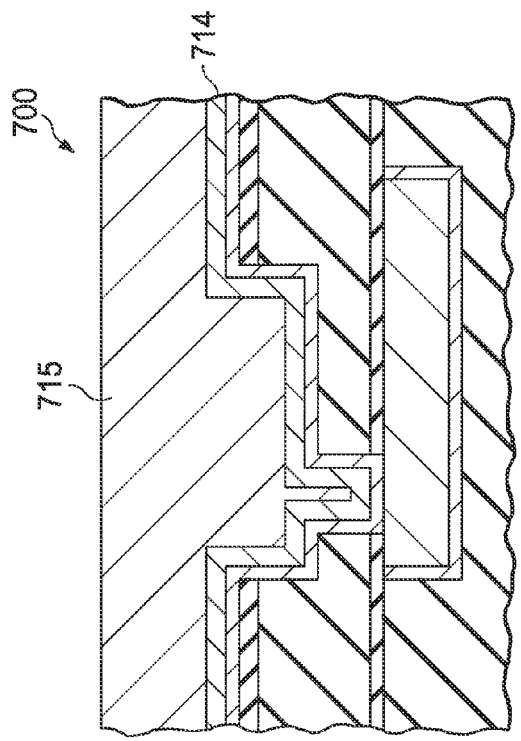
FIGS. 7A-7D are simplified schematic diagrams illustrating a second portion of a semiconductor process to form the semiconductor device structure illustrated in FIG. 4.
Figure 7B:
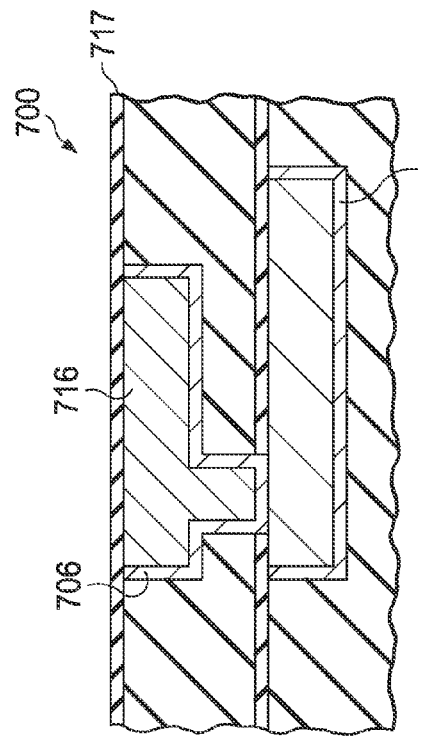
Figure 7C:
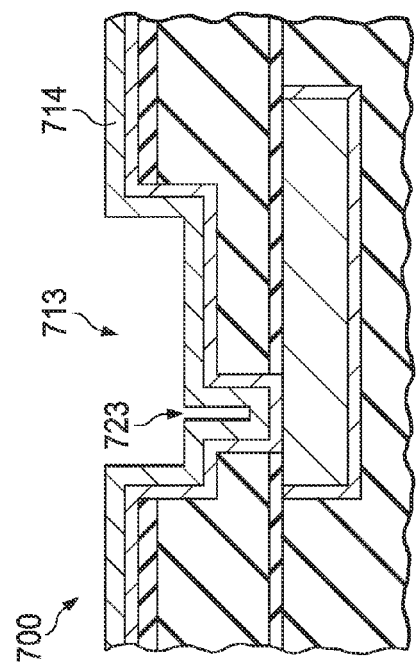
Figure 7D:
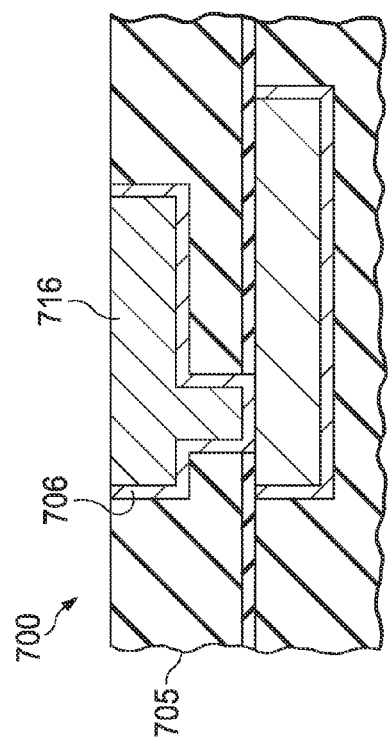
Figure 8:
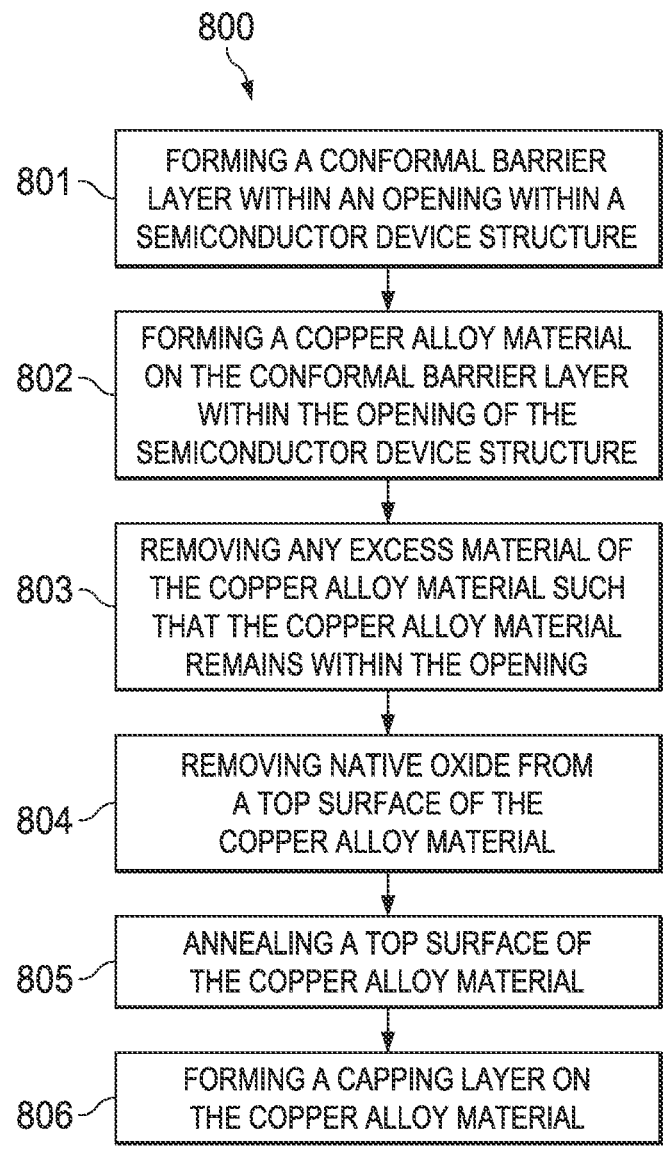
FIG. 8 is a method of forming a semiconductor device structure having components and features consistent with the present disclosure.

FIG. 8 is a method 800 of forming the semiconductor device structure 400 shown in FIG. 4. As such, the semiconductor device structure 400 to be formed has components and features consistent with the present disclosure. The method 800 will be described in reference to FIGS. 6A-6D and FIGS. 7A-7D.

Method 800 begins with step 801—forming a conformal barrier layer within an opening within a semiconductor device structure. Specifically, the conformal barrier layer is formed within a trench of the semiconductor device structure. In some embodiments, the conformal barrier layer is formed during a dual damascene process. The conformal barrier layer may function to prevent metallic materials from diffusing outside of the trench and into dielectric regions. The conformal barrier layer may be formed to a thickness in the range from 30 to 150 angstroms.

Figure 6A:
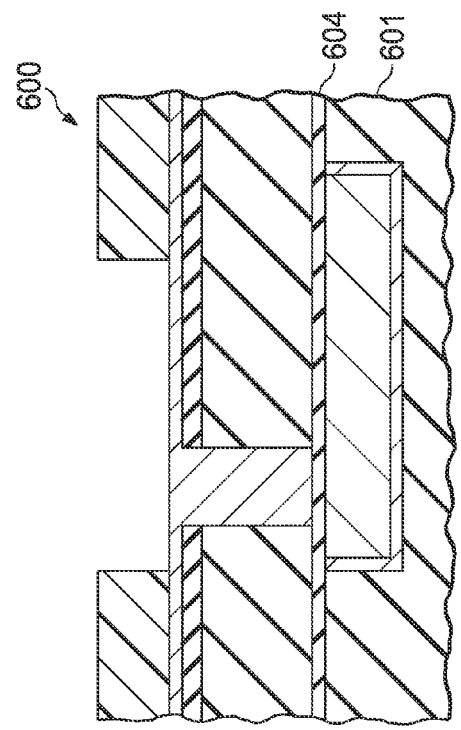
FIGS. 6A-6D are simplified schematic diagrams illustrating a first portion of a semiconductor process to form the semiconductor device structure illustrated in FIG. 4.

Step 801 is illustrated, in part, in FIGS. 6A-6D. FIG. 6A illustrates an opening 610 that is formed by lithography and etch (e.g., reactive-ion etching—RIE) processes. In particular, the opening 610 extends through the semiconductor device structure 600 to a capping layer 604. Opening 610 may be formed during a dual damascene process.

Figure 6B:
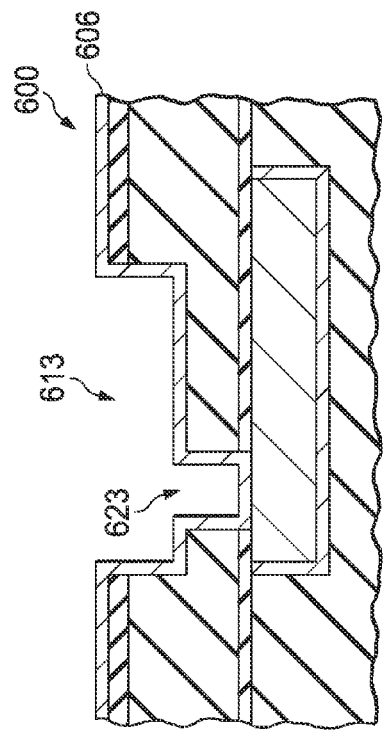
Figure 6C:
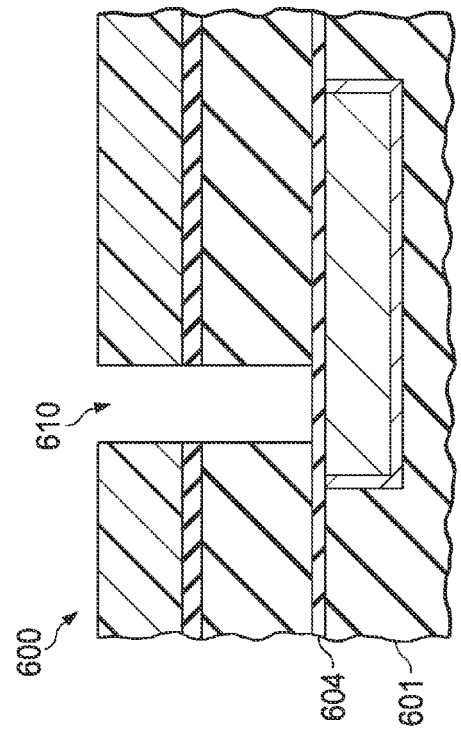

FIG. 6B illustrates a snap shot of a lithography process to form a trench and via within the semiconductor device structure 600. FIG. 6C illustrates the trench 613 and via 623 formed by a reactive-ion etch process.

Figure 6D:
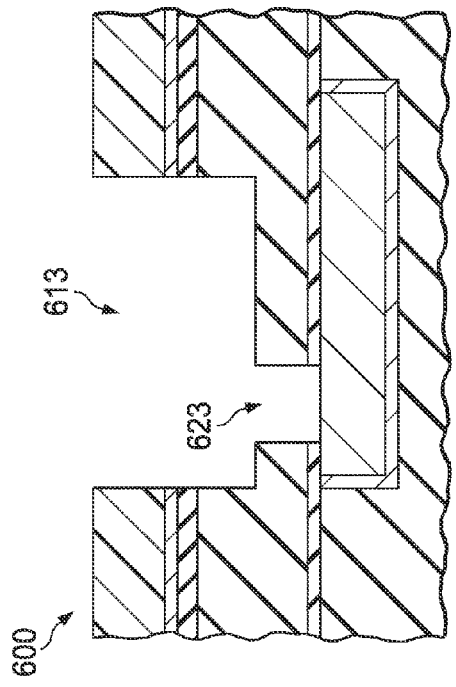

Further, FIG. 6D illustrates a conformal barrier layer 606 formed within and upon the inside surface of the trench 613 and via 623. Conformal barrier layer 606 may comprise any material such that good adhesion is made along the inside surface of the trench 613 and via 623. For example, conformal barrier layer 606 may comprise Ru, W, TiSiN, Ta, TaN, $TaN_x$, RuTaN, or Co. Conformal barrier layer 606 may be formed by various methods such as an ALD process technique.

Next, step 802 provides for forming a copper alloy material on the conformal barrier layer within the opening of the semiconductor device structure 700 as shown in FIGS. 7A-7B. In some embodiments, forming a copper alloy material comprises forming a seed copper material 714 (see FIG. 7A) and a bulk copper metal alloy material 715 (see FIG. 7B) on the inside surface of the trench 713 and vias 723 formed within the dielectric material.

Seed copper material 714 may be formed by a physical vapor deposition (PVD) process. In some embodiments, seed copper material 714 may be subjected to a surface treatment. For example, seed copper material 714 may be cleaned to promote good adhesion between the seed copper material 714 and the bulk copper metal alloy material 715. For instance, a surface treatment may remove native oxide from seed copper material 714.

In some embodiments, bulk copper metal alloy material 715 may be formed by an electrolytic plating process. Bulk copper metal alloy material 715 may comprise any material such that the non-copper atoms limit copper atom migration along the grain boundaries therein. In some embodiments, bulk copper metal alloy material 715 comprises silver.

After the bulk copper metal alloy material 715 is formed within the trench 713 and via 723, step 803 provides removing the bulk copper alloy material 715 that exceeds the trench 713 and via 723 such that a planarized bulk copper alloy material 716 is contained therein (see FIG. 7C). In some embodiments, step 803 is achieved by a chemical mechanical planarization (CMP) process.

Next, according to step 804, native oxide may be removed from a top surface of the planarized bulk copper alloy material 716. As such, a surface treatment may remove native oxide from bulk copper alloy material 716. For example, plasmas may be used for a variety of surface treatments and layer deposition tasks in semiconductor fabrication (e.g., native oxide removal).

"Remote" plasma sources may be used, where the plasma generator is located some distance from the surface to be treated or substrate on which a layer is to be formed. The distance from the surface may allow the charged particles to be filtered in the plasma. For example, the density of ions and electrons may be adjusted by distance. The electrons and ions may be removed from the generated plasma using suitable electrode configurations such as a grounded metal showerhead, so that, for example, only atomic radicals and molecule radicals (but not ions) reach the substrate.

In some embodiments, plasma generated during a plasma enhanced chemical vapor deposition (PECVD) process may remove (e.g., via a plasma etch) native or amorphous oxide present on the planarized bulk copper alloy material 716 prior to forming the capping layers thereon. For example, prior to forming the capping layers, the semiconductor device structure's surface is exposed to a plasma and thereby subjected to bombardment by energetic ions whose kinetic energy may vary from a few electron volts (eV) to hundreds of electron volts according to some embodiments.

Plasma may also be used to pre-treat a substrate prior to a PECVD process. Plasma may be used, for example, to remove contamination such as unwanted oxidation on the surface of a substrate. For example, if planarized bulk copper alloy material 716 has surface oxides, plasma may be applied to remove the unwanted oxides. Other plasma pre-treatments, such as to improve wettability of the substrate, may also be used. The plasma may be applied either to the entire substrate or combinatorially to some site-isolated regions and not to others. Either parameters of the plasma (e.g., plasma gas composition) or the use of plasma versus not using plasma may be varied across site-isolated regions of a substrate and evaluated in a combinatorial process. In some embodiments, combinatorial plasma pre-treatment may be used with subsequent non-combinatorial ALD or CVD processes (i.e., using the same processing conditions across the entire substrate).

In some embodiments, during plasma surface treatment, the process conditions may be as follows: 1) process temperature at about 350° C.; 2) process gas of $NH_3$ gas; and 3) process time in the range of 5-15 seconds.

Next, according to step 805, after the planarized bulk copper metal alloy material 716 is formed, the top surface of the material 716 may be subjected to an annealing procedure. In some embodiments, during annealing the process conditions may be as follows: 1) process temperature between 150° C. to 350° C.; 2) process gases of $N_2$ and $H_2$ gases for annealing; and 3) process time in the range of 5-10 seconds.

After the annealing or surface treatment process, a top surface of the planarized bulk copper alloy material 716 may have a reduced oxygen concentration at the interface between the capping layer (see FIG. 7D) and the planarized bulk of the copper alloy material 716. Because the planarized bulk copper alloy material layer 716 may be subjected to surface treatment, elastic surface scattering may be promoted leading to greater electron mobility.

In addition, surface treatment may also increase interface adhesion strength by reducing any oxygen concentration therein. Moreover, applying an anneal or surface treatment process may suppress Cu-vacancy diffusion at the interface due to the presence of segregated Cu alloy atoms (e.g., Mn-rich Cu layer at the capping interface for Cu—Mn alloy) leading to EM and SM improvements.

In some embodiments, near the top of the planarized bulk copper alloy material 716, the non-copper alloy atoms may have a concentration of approximately 1% of the copper alloy density. For example, when planarized bulk copper alloy material 716 comprises a Cu—Mn alloy, the amount of manganese atoms near the top of the planarized bulk copper alloy material 716 may be approximately $8 \times 10^{20}$ atoms/$cm^3$. However, the amount of manganese atoms in the bulk area of the planarized bulk copper alloy material 716 may be considerably less, approximately $1 \times 10^{20}$ atoms/$cm^3$.

Finally, step 806 provides forming a capping layer 717 on the planarized bulk copper alloy material 716 as shown in FIG. 7D. Capping layer 717 may be formed by various processes such as, but not limited to, electroplating, chemical vapor deposition (CVD), or metal organic chemical vapor deposition (MOCVD) processes. In some embodiments, capping layer 717 may be formed by an electroplating process. Capping layer 717 may comprise any material which may help contain a metallic material. For example, capping layer 717 may comprise SiCN, SiN, CoSnP, CoWP, CoWB, or ZrN.

Combinatorial Processing

Figure 9:
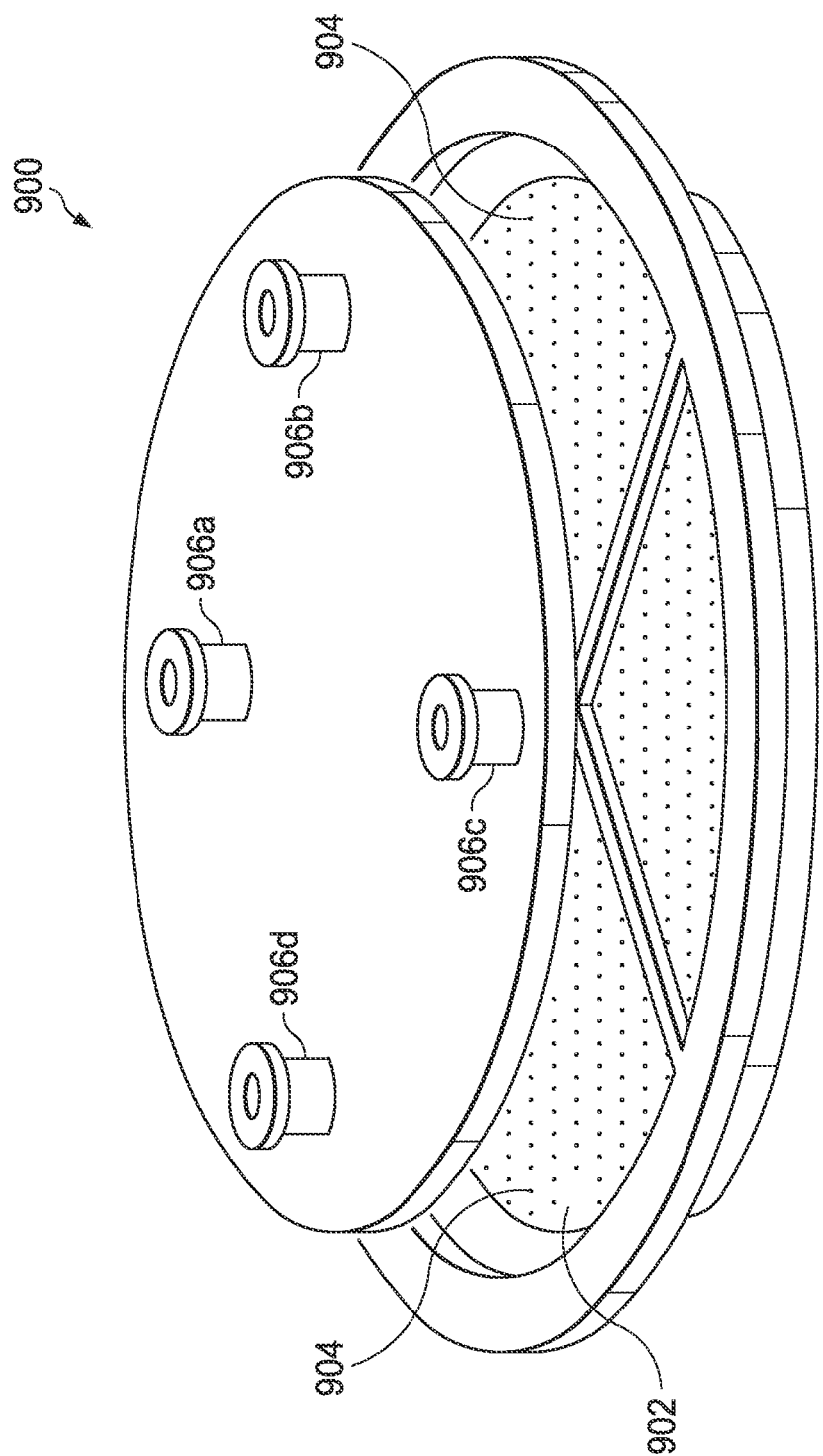
FIG. 9 illustrates an example of a large area ALD or CVD showerhead used for combinatorial processing.

FIG. 9 illustrates an example of a large area ALD or CVD showerhead 900 used for combinatorial processing. Details of this type of showerhead and its use may be found in U.S. patent application Ser. No. 12/013,729 entitled "Vapor Based Combinatorial Processing" filed on Jan. 14, 2008 and claiming priority to Provisional Application No. 60/970,199 filed on Sep. 5, 2001; U.S. patent application Ser. No. 12/013,759 entitled "Vapor Based Combinatorial Processing" filed on Jan. 14, 2008 and claiming priority to Provisional Application No. 60/970,199 filed on Sep. 5, 2001; and U.S. patent application Ser. No. 12/205,578 entitled "Vapor Based Combinatorial Processing" filed on Sep. 5, 2008 which is a Continuation application of the U.S. patent application Ser. No. 12/013,729 and claiming priority to Provisional Application No. 60/970,199 filed on Sep. 5, 2001, all of which are herein incorporated by reference for all purposes.

The large area ALD or CVD showerhead, 900, illustrated in FIG. 9 comprises four regions, 902, used to deposit materials on a substrate. As an example, in the case of a round substrate, four different materials and/or process conditions could be used to deposit materials in each of the four quadrants of the substrate (not shown). Precursor gases, reactant gases, purge gases, etc. are introduced into each of the four regions of the showerhead through gas inlet conduits 906a-906d. For simplicity, the four regions, 902, of showerhead, 900, have been illustrated as being a single chamber. Those skilled in the art will understand that each region, 902, of showerhead, 900, may be designed to have two or more isolated gas distribution systems so that multiple reactive gases may be kept separated until they react at the substrate surface. Also for simplicity, on a single gas inlet conduit, 906a-906d, is illustrated for each of the four regions. Those skilled in the art will understand that each region, 902, of showerhead, 900, may have multiple gas inlet conduits. The gases exit each region, 902, of showerhead, 900, through holes, 904, in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 9 is operable to be used with any ALD or plasma enhanced ALD technology.

As discussed previously, showerhead, 900, in FIG. 9 results in a deposition (or other process type) on a relatively large region of the substrate. In this example, a quadrant of the substrate. To address the limitations of the combinatorial showerhead illustrated in FIG. 9, small spot showerheads have been designed—see FIG. 10.

Figure 10:
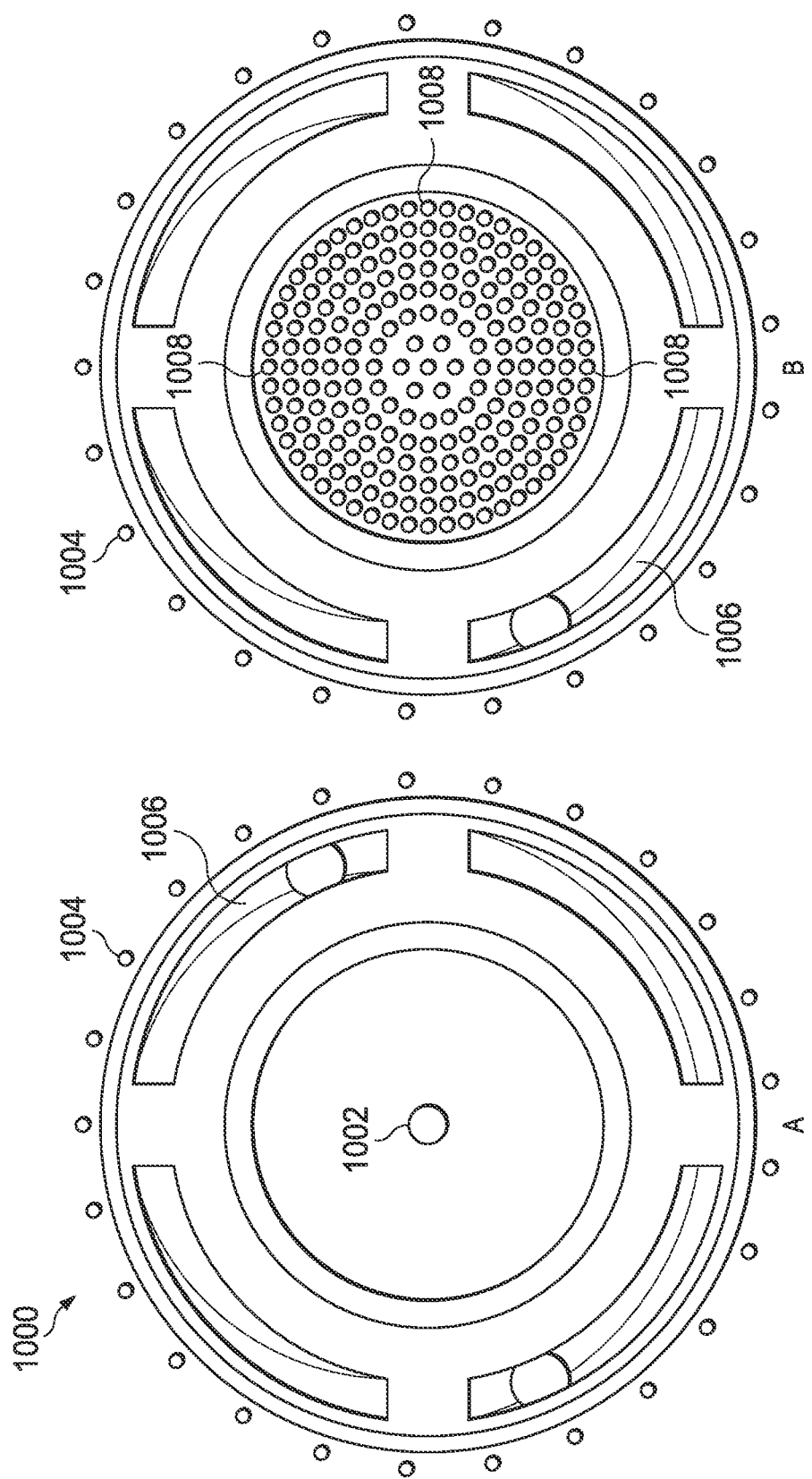
FIG. 10 illustrates a bottom view of two examples of a small spot showerhead apparatus.

FIG. 10 illustrates a bottom view of two examples of a small spot showerhead apparatus 1000. The small spot showerhead configuration, A, illustrated in FIG. 10 comprises a single gas distribution port, 1002, in the center of the showerhead for delivering reactive gases to the surface of the substrate. The small size of the small spot showerhead and the behavior of the technologies envisioned to use this showerhead ensure that the uniformity of the process on the substrate is adequate using the single gas distribution port. However, the small spot showerhead configuration, B, illustrated in FIG. 10 comprises a plurality of gas distribution ports, 1008, for delivering reactive gases to the surface of the substrate. This configuration may be used to improve the uniformity of the process on the substrate if required.

Each small spot showerhead is surrounded by a plurality of purge holes, 1004. The purge holes introduce inert purge gases (i.e., Ar, $N_2$, etc.) around the periphery of each small spot showerhead to insure that the regions under each showerhead may be processed in a site isolated manner. The gases, both the reactive gases and the purge gases, are exhausted from the process chamber through exhaust channels, 1006, that surround each of the showerheads. The combination of the purge holes, 1004, and the exhaust channels, 1006, ensure that each region under each showerhead may be processed in a site-isolated manner. The diameter of the small spot showerhead (i.e., the diameter of the purge ring) may vary between about 40 mm and about 100 mm. Advantageously, the diameter of the small spot showerhead is about 65 mm.

Using a plurality of small spot showerheads as illustrated in FIG. 10 allows a substrate to be processed in a combinatorial manner wherein different parameters may be varied as discussed above. Examples of the parameters comprise process material composition, process material amounts, reactant species, processing temperatures, processing times, processing pressures, processing flow rates, processing powers, processing reactant compositions, the rates at which the reactions are quenched, atmospheres in which the processes are conducted, an order in which materials are deposited, etc.

Figure 11:
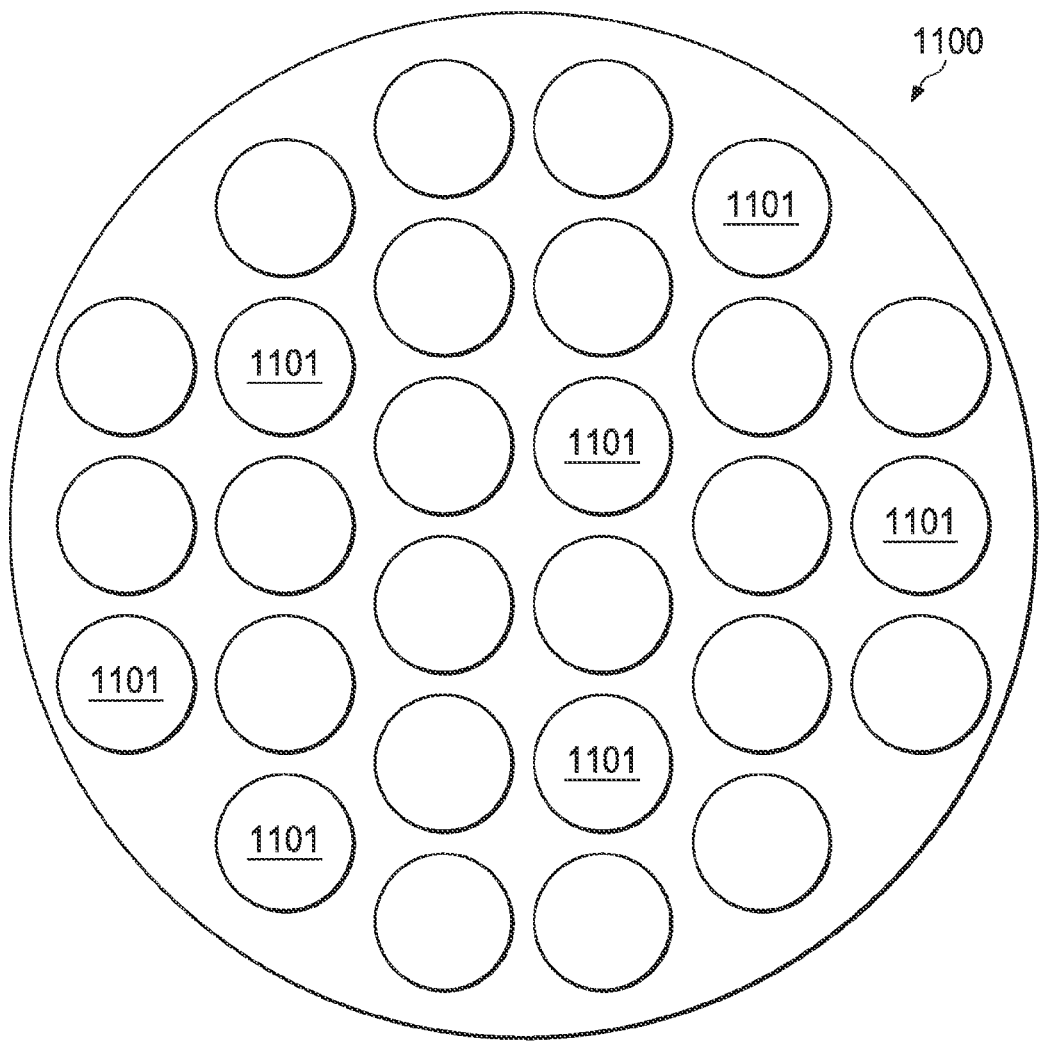
FIG. 11 illustrates one example of a pattern of site-isolated regions that may be processed using a small spot showerhead apparatus.

FIG. 11 illustrates one example of a pattern of site-isolated regions 1101 that may be processed using a small spot showerhead apparatus. In some embodiments, the substrate 1100 may be divided into quadrants (e.g., four) and within each quadrant, a plurality of site-isolated regions 1101 may be processed using the small spot showerheads illustrated in FIG. 10. In FIG. 11, twenty-eight site-isolated regions 1101 are present on the substrate 1100. Therefore, in this example, twenty-eight independent experiments may be performed on a single substrate.

The substrate 1100 may be a wafer having a diameter, such as 300 mm. In other embodiments, substrate 1100 may have other shapes, such as square or rectangular. It should be understood that the substrate 1100 may be a blanket substrate (i.e., having a substantial uniform surface), a coupon (e.g., partial wafer), or even a patterned substrate having predefined regions, such as site-isolated regions 1101.

The site-isolated regions 1101 may also have a certain shape, such as circular, rectangular, elliptical, or wedge-shaped. A site-isolated region 1101 may be, for example, a test structure, single die, multiple die, portion of a die, other defined portion of the substrate 1100, or an undefined area of the substrate 1100 that may be subsequently defined through processing.

Figure 12A:
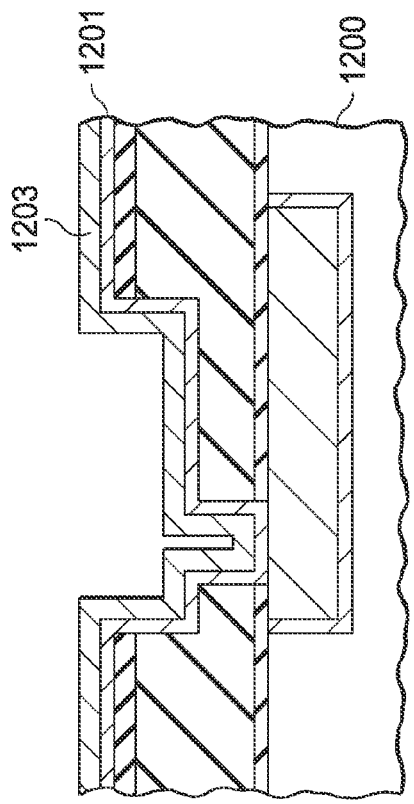
FIGS. 12A-12D illustrates an exemplary deposition sequence for forming multilayer film stacks in a combinatorial fashion.

FIGS. 12A-12D illustrate an exemplary sequence for forming metal interconnects. A sequence for forming metal interconnects comprising a conformal barrier layer, seed metal layer, bulk metal layer, and a capping layer within a semiconductor device structure will be used as an example. Those skilled in the art will understand that the semiconductor device structure may have several layers, features, and components already formed thereon. For example, FIG. 12A illustrates a substrate 1200 (e.g., portion of a semiconductor device structure) having trenches and vias therein.

It should be understood by one having ordinary skill in the art that the substrate 1200 may be a full wafer, previously processed or unprocessed. In addition, substrate 1200 may be a semiconductor device structure having a plurality of trenches and vias, as described above, such that a metal interconnect is formed therein.

FIG. 12A further illustrates a conformal barrier layer 1201 formed upon the substrate 1200. Conformal barrier layer 1201 may be formed upon substrate 1200 by various methods such as an ALD process. In some embodiments, the thickness of conformal barrier layer 1201 may be in the range of 20-70 Å. In some embodiments, conformal barrier layer 1201 may comprise Ru, W, TiSiN, Ta, TaN, RuTaN, Ta/TaN, or Co.

Figure 12B:
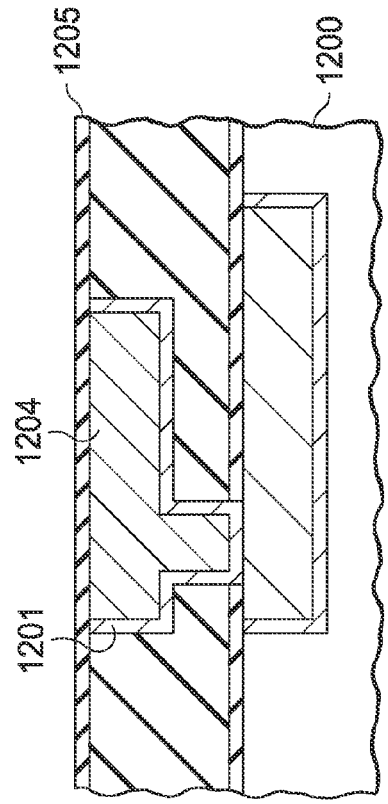

FIG. 12B illustrates a seed metal layer 1203 formed above the substrate 1200 and conformal barrier layer 1201. In some embodiments, seed metal layer 1203 comprises a copper seed material. As illustrated in FIG. 12B, seed metal layer 1203 may be formed within a trench and via of a site-isolated region by using a conventional deposition chamber or using a combinatorial deposition chamber. In some embodiments, seed metal layer 1203 may be formed by a PVD process.

Figure 12C:
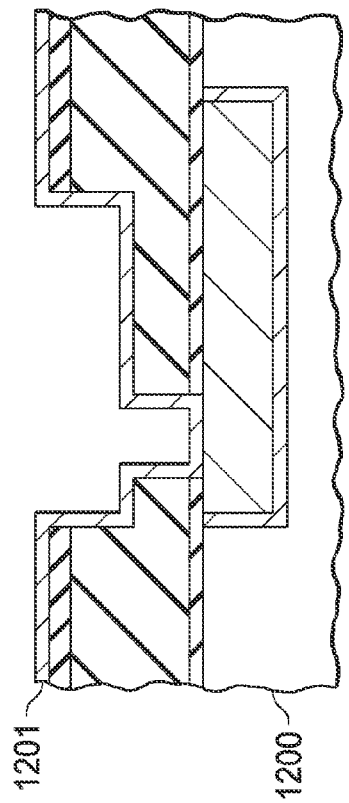

In FIG. 12C, a bulk metal layer 1204 is formed above the seed metal layer wherein the conformal barrier layer 1201, seed metal layer 1203, and bulk metal 1204 are collectively a metal interconnect. In some embodiments, bulk metal layer 1204 is formed by an electroplating process.

Most notably, bulk metal layer 1204 includes a metal alloy that contains a low resistive metal material. In some embodiments, the low resistive metal material may comprise any of the following: gold (Au), silver (Ag), and carbon (C). In addition, a CMP process may be applied to substrate 1200 to contain the bulk metal layer 1204 within the trenches and vias. In addition, bulk metal layer 1204 may be subjected to an anneal or surface treatment as previously described.

Figure 12D:
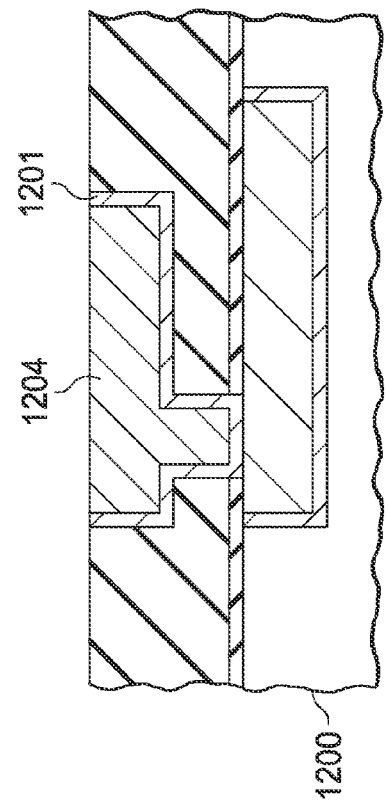

FIG. 12D illustrates a capping layer 1205 formed on the bulk metal layer 1204. Capping layer 1205 may be formed by an electroplating process according to some embodiments. Capping layer 1205 may also be formed by a CVD or MOCVD process. As illustrated in FIG. 12D, capping layer 1205 may be formed on the bulk metal layer 1204 within a site-isolated region by using a conventional deposition chamber or a combinatorial deposition chamber. In some embodiments, when capping layer 1205 is formed by a CVD process, the capping layer 1205 may be formed in a combinatorial deposition chamber.

Capping layer 1205 may comprise any suitable material which prevents metal formed within the trench from diffusing therefrom and into a dielectric region of the semiconductor device structure. For example, capping layer 1205 may comprise CoSnP, CoWP, CoWB, SiCN, or SiN. Furthermore, capping layer 1205 is subjected to surface treatments as described above.

FIG. 12D illustrates a single metal interconnect experiment. The single experiment may include one of various precursor chemicals, reactant chemicals, precursor/reactant delivery conditions (i.e., flow rates, pressure, pulse times, etc.), process temperatures, annealing conditions, surface treatments, etc. The metal interconnect may be tested to determine the optimum material and/or processing conditions. Typical tests may comprise measuring conductivity, resistivity, time dependent dielectric breakdown (TDDB), EM, SM, etc.

Figure 13B:
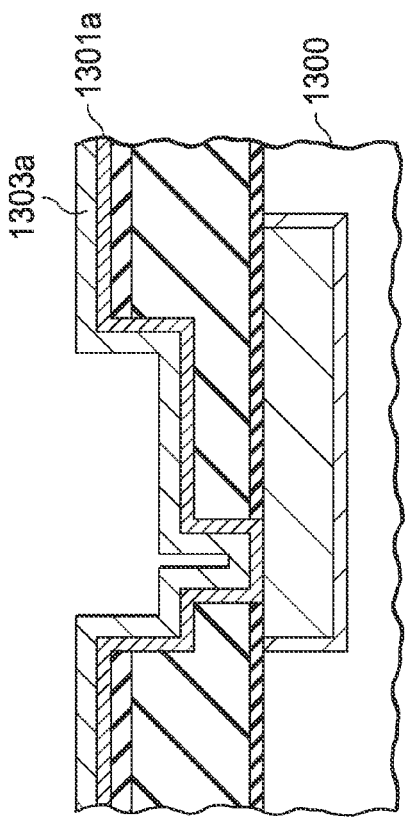
Figure 13B:
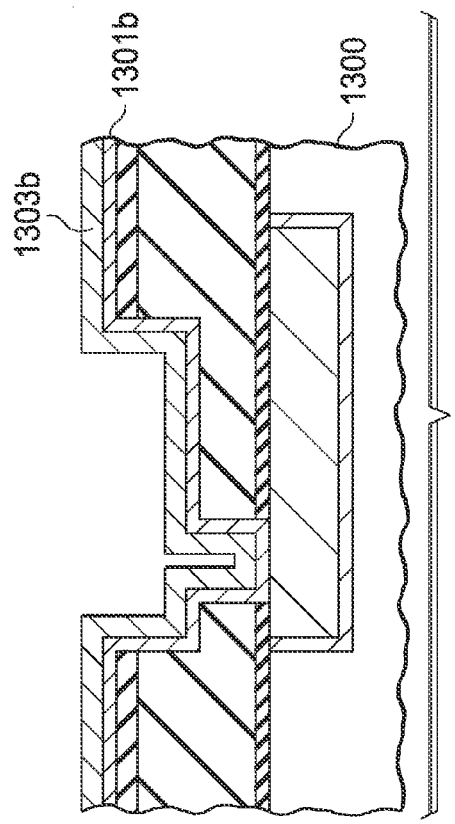
Figure 13A:
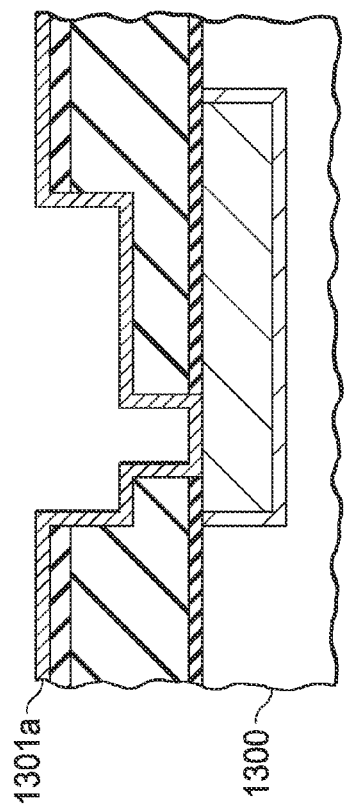
Figure 13A:
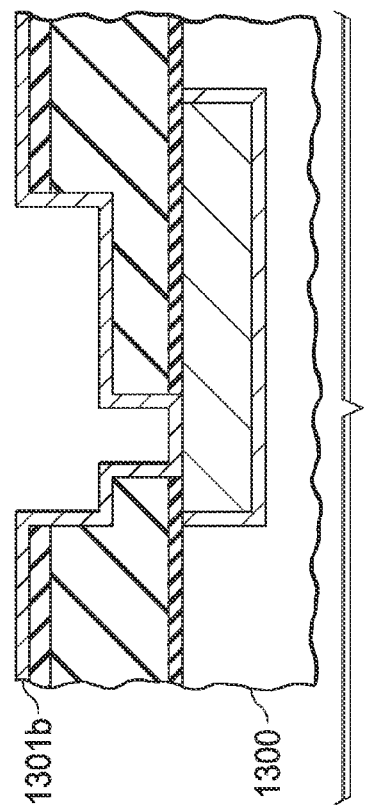

FIGS. 13A-13D illustrate an exemplary sequence for forming metal interconnects in a combinatorial fashion. A sequence for forming metal interconnects comprising a conformal barrier layer, seed metal layer, bulk metal layer, and a capping layer within a semiconductor device structure will be used as an example. Those skilled in the art will understand that the semiconductor device structure may already have several layers, features, and components thereon. For example, FIG. 13A illustrates a substrate 1300 (e.g., portion of a semiconductor device structure) having trenches and vias therein.

FIG. 13A further illustrates a first conformal barrier layer 1301a and a second conformal barrier layer 1301b formed upon the substrate 1300 in two different site-isolated regions. As previously described, a first conformal barrier layer 1301a and a second conformal barrier layer 1301b may be formed within the trenches and vias of site-isolated regions by various methods such as an ALD process. In some embodiments, first conformal barrier layer 1301a and a second conformal barrier layer 1301b comprise different materials.

In FIG. 13B, two alternatives 1303a, 1303b of a seed metal layer are formed above the conformal barrier layers 1301a, 1301b. In some embodiments, seed metal layers 1303a, 1303b may be formed within trenches and vias of two site-isolated regions by various methods such as a PVD process. Each seed metal layer 1303a, 1303b may be formed in a combinatorial deposition chamber.

Seed metal layer 1303a may comprise a copper seed metal material formed by a first set of processing conditions. Alternatively, a seed metal layer 1303b may comprise a copper seed metal material formed by a second set of processing conditions.

In FIG. 13C, bulk metal layers 1304a, 1304b are shown to be formed above the seed metal layers 1303a, 1303b. In some embodiments, bulk metal layers 1304a, 1304b comprise different materials. For example, bulk metal layer 1304a may comprise a copper/silver alloy whereas bulk metal layer 1304b may comprise a copper/gold alloy. In addition, a CMP process may be applied to substrate 1300 to contain the bulk metal layers 1304a, 1304b within the trenches and vias. Furthermore, bulk metal layer 1304a, 1304b may be subjected to an anneal or surface treatment as previously described.

FIG. 13D illustrates capping layers 1305a, 1305b formed on the bulk metal layers 1304. Capping layers 1305a, 1305b may be formed by an electroplating, CVD, or MOCVD process. In some embodiments, when capping layers 1305a, 1305b are formed in a combinatorial deposition chamber, capping layer 1305a may comprise a first material and capping layer 1305b may comprise a second material. For example, capping layer 1305a comprises CoSnP and capping layer 1305b may comprise CoWP. Furthermore, capping layers 1305a, 1305b are subjected to surface treatments as described above.

FIG. 13D illustrates two metal interconnect experiments which may represent the combinatorial variation of precursor chemicals, reactant chemicals, precursor/reactant delivery conditions (i.e., flow rates, pressure, pulse times, etc.), process temperatures, annealing conditions, surface treatments, etc. Each metal interconnect may be tested to determine the optimum material and/or processing conditions. Typical tests may comprise measuring conductivity, resistivity, line to line resistances, time dependent dielectric breakdown (TDDB), EM, SM, etc.

Figure 14A:
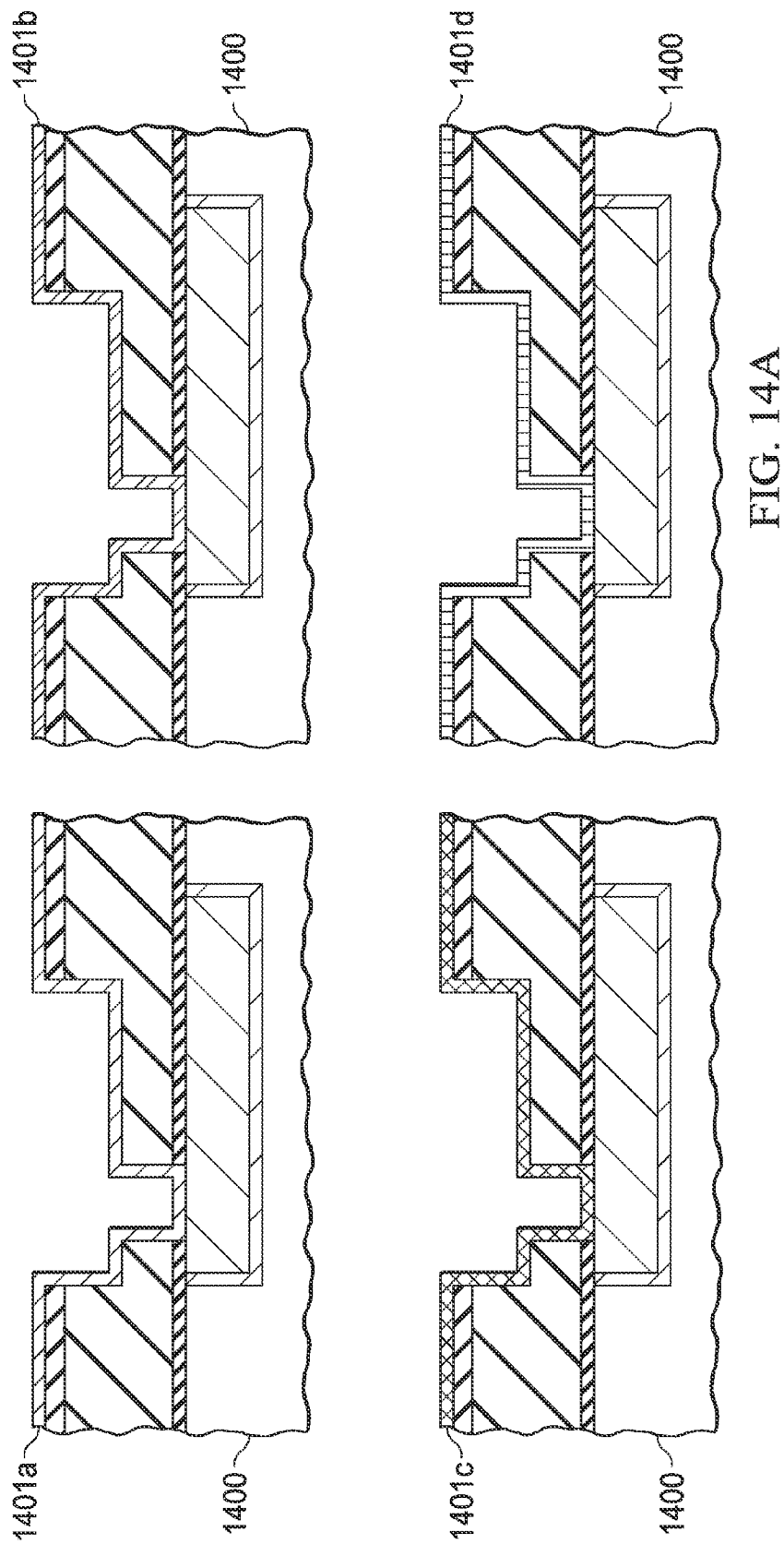
FIGS. 14A-14D illustrates an exemplary deposition sequence for forming multilayer film stacks in a combinatorial fashion.

FIGS. 14A-14D illustrates an exemplary sequence for forming metal interconnects in a combinatorial fashion. A sequence for forming metal interconnects comprising a conformal barrier layer, seed metal layer, bulk metal layer, and a capping layer within a semiconductor device structure will be used as an example. Those skilled in the art will understand that the substrate may already have several layers, features, and components thereon. FIG. 14A illustrates a substrate 1400 (e.g., portion of a semiconductor device structure) having trenches and vias therein.

FIG. 14A illustrates conformal barrier layers 1401 formed upon the substrate 1400 in four site-isolated regions. In some embodiments, conformal barrier layers 1401a-1401d may be formed within trenches and vias of site-isolated regions by various methods such as an ALD process.

Figure 14B:
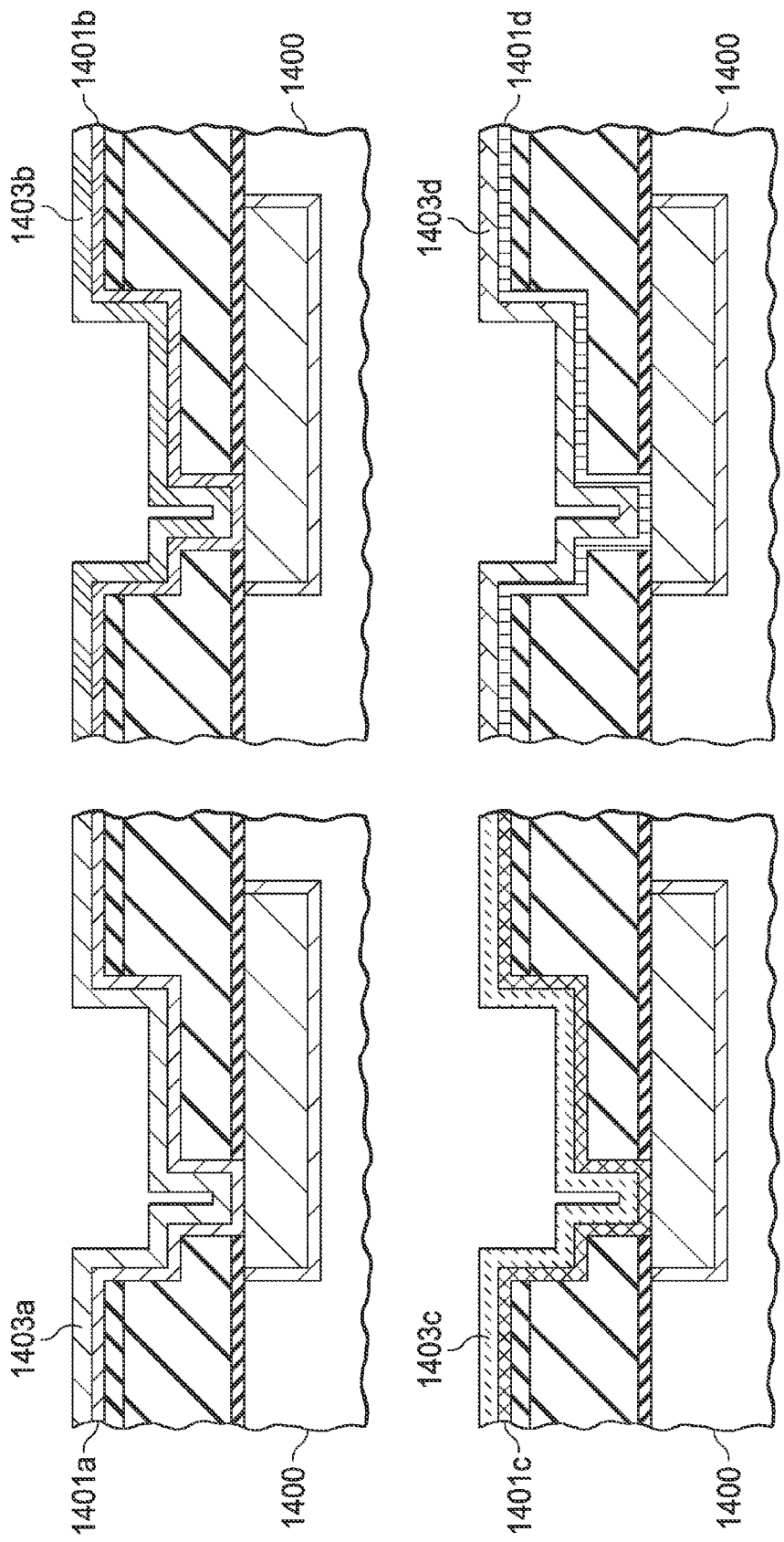

Moving forward, FIG. 14B illustrates four alternatives 1403a-1403d of a seed metal layer formed above the conformal barrier layers 1401a-1401d. In some embodiments, seed metal layers 1403a-1403d may be formed within trenches and vias of four site-isolated regions by various methods such as a PVD process. Each seed metal layer 1403a-1403d may be formed in a combinatorial deposition chamber.

For example, a first seed metal layer 1403*a* may comprise a copper seed metal material formed by a first set of processing conditions whereas a second seed metal layer 1403*b* may comprise a copper seed metal material formed by a second set of processing conditions. Likewise, third and fourth seed metal layers 1403*c*, 1403*d* may be formed by third and fourth sets of processing conditions.

Figure 14C:
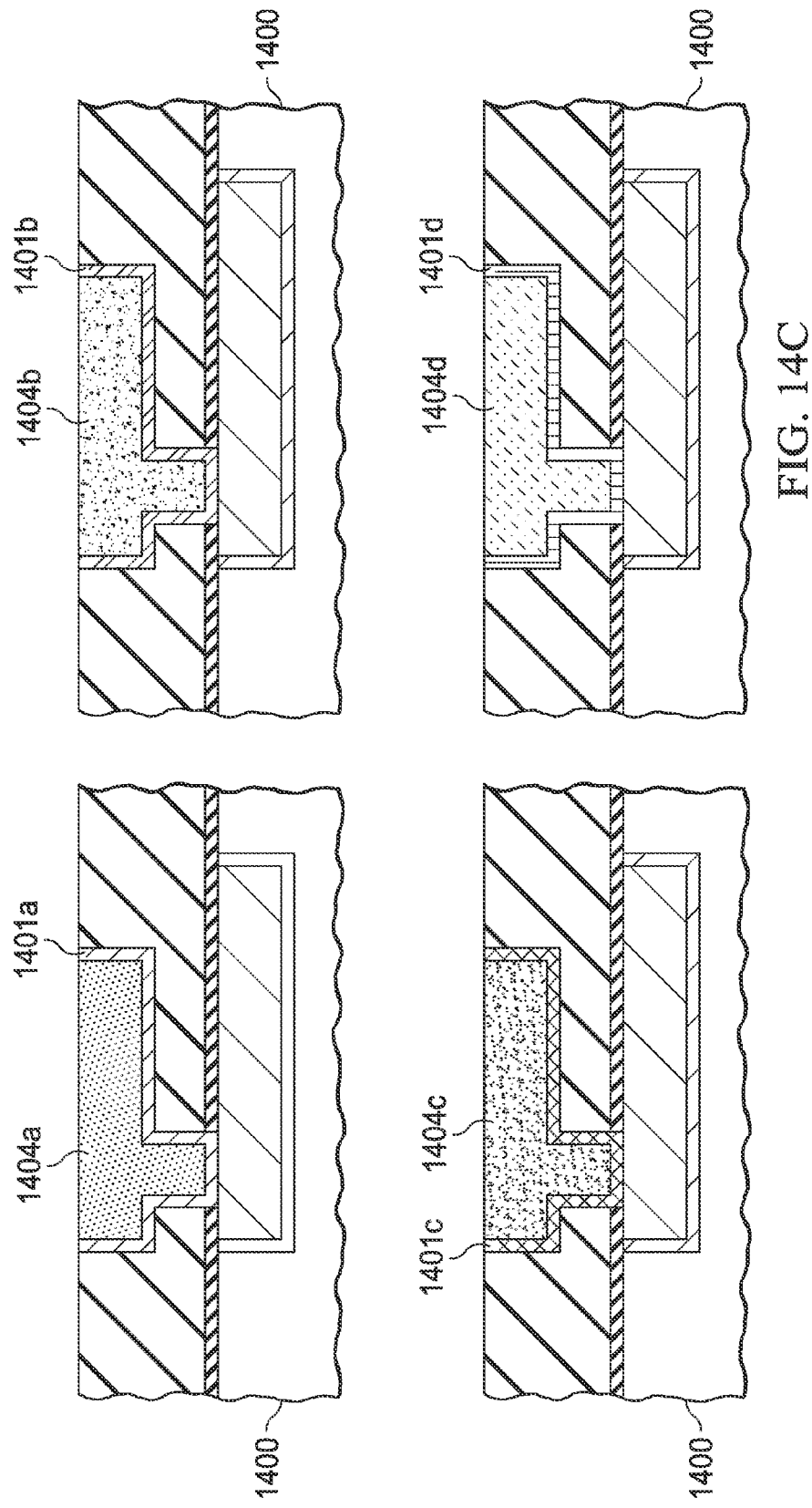

In FIG. 14C, a bulk metal materials 1404*a*-1404*d* is formed above the seed metal layers 1403*a*-1403*d*. In some embodiments, bulk metal layers 1404*a*-1404*d* comprise different materials. For example, bulk metal layer 1404*a* may comprise a copper/silver alloy and bulk metal layer 1404*b* may comprise a copper/gold alloy. Further, bulk metal layer 1404*c* and 1404*d* may comprise a copper/CNT alloy. However, bulk metal layers 1404*c* and 1404*d* may be formed by different process conditions.

In addition, a CMP process may be applied to substrate 1400 to contain the bulk metal layers 1404*a*-1404*d* within the trenches and vias. Furthermore, bulk metal layer 1404*a*-1404*d* may be subjected to an anneal or surface treatment as previously described.

Figure 14D:
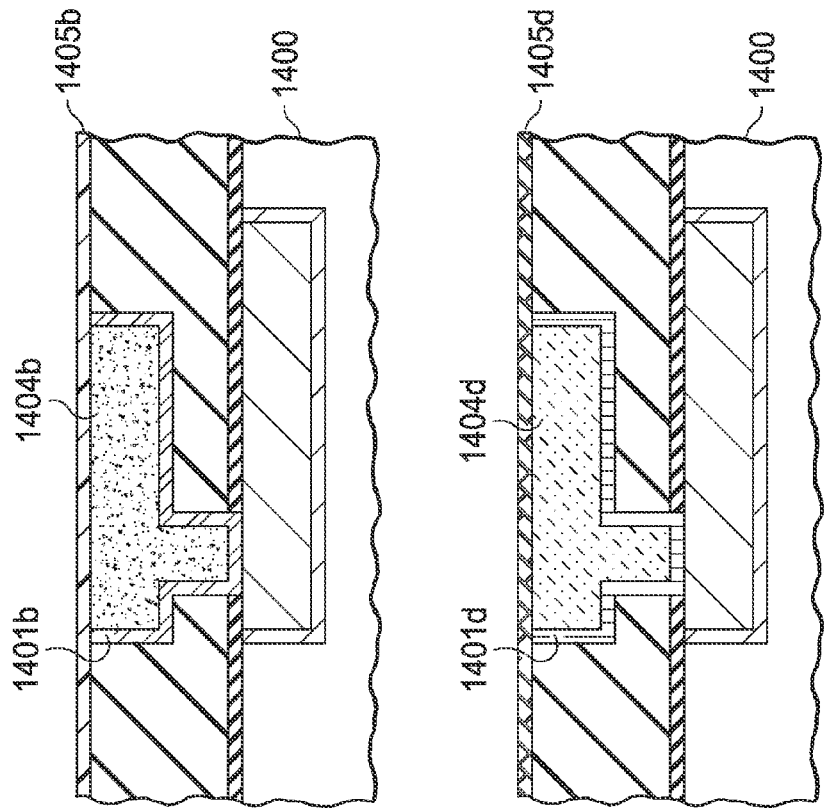
Figure 14D:
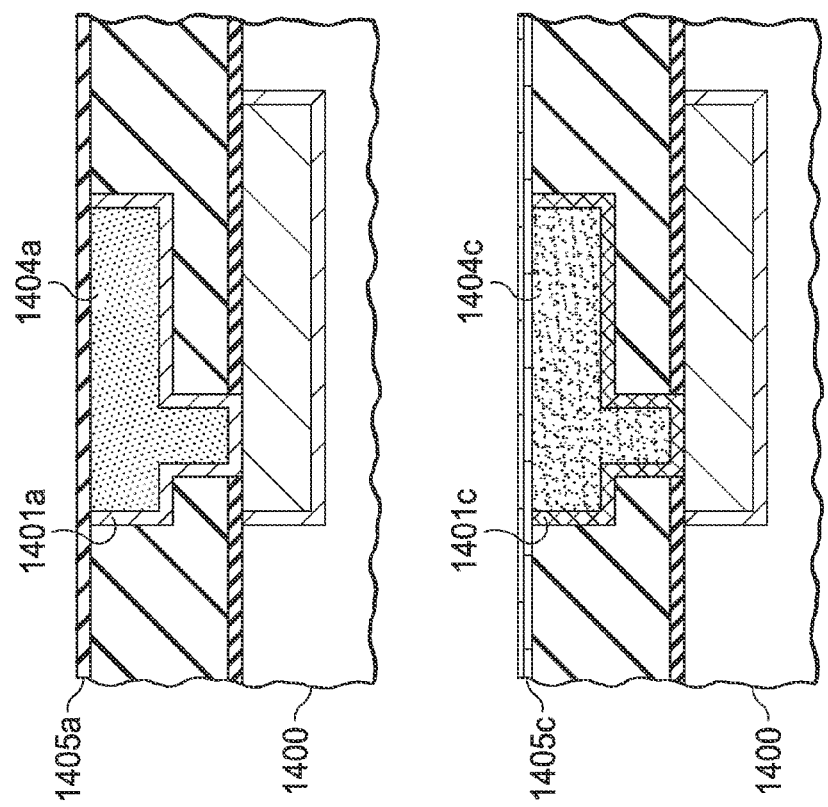

FIG. 14D illustrates capping layers 1405*a*-1405*d* formed on the bulk metal layers 1404*a*-1404*d*. As described, capping layers 1405*a*-1405*d* may be formed by an electroplating, CVD, or MOCVD process. In some embodiments, capping layers 1405*a*-1405*d* comprise different material and may be processed by a different set of conditions. For example, first capping layer 1405*a* comprises CoSnP, second capping layer 1405*b* comprises CoWP, third capping layer 1405*c* comprises SIGN, and fourth capping layer 1405*d* comprises SiN. Furthermore, capping layers 1405*a*-1405*d* may be subjected to surface treatments as described above.

FIG. 14D illustrates four metal interconnect experiments which may represent the combinatorial variation of precursor chemicals, reactant chemicals, precursor/reactant delivery conditions (i.e., flow rates, pressure, pulse times, etc.), process temperatures, annealing conditions, surface treatments, etc. Each metal interconnect may be tested to determine the optimum material and/or processing conditions. Typical tests may comprise measuring conductivity, resistivity, time dependent dielectric breakdown (TDDB), EM, SM, etc.

Methods and apparatuses for combinatorial processing have been described. It will be understood that the descriptions of some embodiments of the present disclosure do not limit the various alternative, modified and equivalent embodiments which may be included within the spirit and scope of the present disclosure as defined by the appended claims. Furthermore, in the detailed description above, numerous specific details are set forth to provide an understanding of various embodiments of the present disclosure. However, some embodiments of the present disclosure may be practiced without these specific details. In other instances, well known methods, procedures, and components have not been described in detail so as not to unnecessarily obscure aspects of the present embodiments.

What is claimed is:

1. A method for processing of a substrate in a combinatorial manner, the method comprising:
   providing a substrate comprising a plurality of site-isolated regions and using a combinatorial showerhead for processing the plurality of site-isolated regions in a combinatorial manner, comprising:
      forming a barrier layer within an opening in each site-isolated region of the plurality of site-isolated regions;
      forming a copper alloy material above the barrier layer in the each site-isolated region;
      removing any copper alloy material that extends beyond the opening in the each site-isolated region;
      removing native oxide from a top surface of any remaining copper alloy material in the each site-isolated region;
      annealing the remaining copper alloy material in the each site-isolated region; and
      forming a capping layer above the remaining copper alloy material in the each site-isolated region.

2. The method of claim 1, wherein the opening comprises a trench and a via.

3. The method of claim 1, wherein forming the copper alloy material comprises forming the copper alloy material by a physical vapor deposition (PVD) process.

4. The method of claim 1, wherein forming the copper alloy material comprises forming a seed copper material and forming a bulk copper alloy material within the opening.

5. The method of claim 4, wherein the bulk layer comprises a metal alloy comprising a low resistive metal material,
   wherein the low resistive metal material comprises at least one of gold, silver, or carbon.

6. The method of claim 4, wherein forming the seed copper material comprises forming the seed copper material by a physical vapor deposition (PVD) process.

7. The method of claim 4, wherein forming the bulk copper alloy material comprises forming the bulk copper alloy material by an electrolytic plating process.

8. The method of claim 4, wherein the seed copper material is cleaned prior to forming the bulk copper alloy material.

9. The method of claim 1, wherein annealing the remaining copper alloy material in the each site-isolated region is performed at a process temperature between about 150° C. to about 350° C.

10. The method of claim 1, wherein annealing the remaining copper alloy material in the each site-isolated region comprises annealing with at least one process gas that is one of
    $N_2$ and $H_2$ gases, or
    $NH_3$ gas.

11. The method of claim 1 further comprising applying a surface treatment to the capping layer.

12. The method of claim 1, wherein the copper alloy material that extends beyond the opening is removed by a chemical mechanical planarization (CMP) process.

13. The method of claim 1, wherein the capping layer is formed by an atomic layer deposition (ALD) process.

14. The method of claim 1, wherein copper grain growth within fifty angstroms of an interface between the capping layer and the remaining copper alloy material is smaller than copper grain growth in a bulk of the remaining copper alloy material; and
    wherein within fifty angstroms of the interface between the capping layer and the remaining copper alloy material is a quantity of non-copper alloy atoms that is five to eight times greater than a quantity of non-copper alloy atoms in the bulk of the remaining copper alloy material.

15. The method of claim 1, wherein processing conditions or resulting compositions are varied combinatorially among the plurality of site isolated regions.

16. The method of claim 1, wherein the barrier layer comprises at least one of Ru, W, TiSiN, Ta, TaN, RuTaN, Ta/TaN, or Co.

17. The method of claim 1, wherein the barrier layer has a thickness between about 20 Å to about 70 Å.

18. The method of claim 1, wherein the capping layer comprises at least one of SiCN, SiN, CoSnP, CoWP, CoWB, or ZrN.

19. A method of forming metal interconnects within a semiconductor substrate in a combinatorial manner, the method comprising:

provide a substrate comprising a plurality of site-isolated regions, wherein the plurality of site-isolated regions comprises at least a first site-isolated region and a second site-isolated region, using a combinatorial showerhead for processing the plurality of site-isolated regions in a combinatorial manner, comprising forming a first opening in the first site-isolated region;

forming a first barrier layer within the first opening;

forming a first seed copper layer above the first barrier layer;

forming a first copper alloy material above the first copper seed layer;

forming a first capping layer above the first copper alloy material;

wherein the first barrier layer, the first seed copper layer, and the first copper alloy material form a first metal interconnect within the first opening;

forming a second opening in the second site-isolated region;

forming a second barrier layer inside of the second opening;

forming a second seed copper layer above the second barrier layer;

forming a second copper alloy material above the second seed copper layer;

forming a second capping layer above the second copper alloy material;

wherein the second barrier layer, the second copper seed layer, and the second copper alloy material form a second metal interconnect within the second opening;

wherein a first plurality of non-copper atoms and a second plurality of non-copper atoms are different;

wherein processing conditions or resulting compositions are varied combinatorially among the plurality of site isolated regions; and evaluating results of the first metal interconnect and the second metal interconnect.

20. The method of claim 19, wherein evaluating the results comprises comparing a physical characteristic or an electrical characteristic of the first metal interconnect and the second metal interconnect.

* * * * *